United States Patent
Ma

(10) Patent No.: US 10,497,817 B1
(45) Date of Patent: Dec. 3, 2019

(54) P-N DIODES AND P-N-P HETEROJUNCTION BIPOLAR TRANSISTORS WITH DIAMOND COLLECTORS AND CURRENT TUNNELING LAYERS

(71) Applicant: Wisconsin Alumni Research Foundation, Madison, WI (US)

(72) Inventor: Zhenqiang Ma, Middleton, WI (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 0 days.

(21) Appl. No.: 16/029,811

(22) Filed: Jul. 9, 2018

(51) Int. Cl.
| | | |
|---|---|---|
| *H01L 29/88* | (2006.01) | |
| *H01L 29/861* | (2006.01) | |
| *H01L 29/45* | (2006.01) | |
| *H01L 29/737* | (2006.01) | |
| *H01L 29/205* | (2006.01) | |

(Continued)

(52) U.S. Cl.
CPC .......... *H01L 29/88* (2013.01); *H01L 29/1602* (2013.01); *H01L 29/205* (2013.01); *H01L 29/267* (2013.01); *H01L 29/45* (2013.01); *H01L 29/6603* (2013.01); *H01L 29/66037* (2013.01); *H01L 29/7378* (2013.01); *H01L 29/8613* (2013.01); *H01L 21/0259* (2013.01); *H01L 21/0262* (2013.01); *H01L 21/02488* (2013.01); *H01L 21/02527* (2013.01); *H01L 21/02546* (2013.01); *H01L 29/0665* (2013.01); *H01L 29/0821* (2013.01); *H01L 29/1004* (2013.01)

(58) Field of Classification Search
CPC ... H01L 29/88; H01L 29/1602; H01L 29/205; H01L 29/267; H01L 29/45; H01L 29/6603; H01L 29/66037; H01L 29/378; H01L 29/8613; H01L 21/02488; H01L 21/02527; H01L 21/02546; H01L 21/0259; H01L 21/0262; H01L 29/0665; H01L 29/0821; H01L 29/1004
See application file for complete search history.

(56) References Cited

U.S. PATENT DOCUMENTS

| | | | | |
|---|---|---|---|---|
| 5,285,089 A | * | 2/1994 | Das | ............... H01L 29/1602 257/197 |
| 5,371,378 A | * | 12/1994 | Das | ............... H01L 29/1602 257/197 |

(Continued)

FOREIGN PATENT DOCUMENTS

| | | |
|---|---|---|
| JP | 2005-512327 | 4/2005 |
| KR | 10-2003-0063075 | 7/2003 |

OTHER PUBLICATIONS

Gui et al., The effect of surface roughness on direct wafer bonding, Journal of Applied Physics, vol. 85, No. 10, May 15, 1999, pp. 7448-7454.

(Continued)

*Primary Examiner* — Peter Bradford
(74) *Attorney, Agent, or Firm* — Bell & Manning, LLC; Michelle Manning

(57) ABSTRACT

P-N diodes that include p-type doped diamond and devices, such as p-n-p heterojunction bipolar transistors, that incorporate the p-n diodes are provided. In the p-n diodes, the diamond at the p-n junction has a positive electron affinity and is passivated by a thin layer of inorganic material that provides a tunneling layer that passivates the bonding interface states, without hindering carrier transport across the interface.

12 Claims, 19 Drawing Sheets

(51) Int. Cl.
  *H01L 29/267* (2006.01)
  *H01L 29/66* (2006.01)
  *H01L 29/16* (2006.01)
  *H01L 21/02* (2006.01)
  *H01L 29/08* (2006.01)
  *H01L 29/10* (2006.01)
  *H01L 29/06* (2006.01)

(56) References Cited

U.S. PATENT DOCUMENTS

| | | | |
|---|---|---|---|
| 6,881,988 | B2 | 4/2005 | Niwa et al. |
| 7,030,428 | B2 | 4/2006 | Saxler |
| 7,354,809 | B2 | 4/2008 | Yuan et al. |
| 7,777,290 | B2 | 8/2010 | Lagally et al. |
| 8,217,410 | B2 | 7/2012 | Ma et al. |
| 8,232,617 | B2 | 7/2012 | Ma et al. |
| 8,866,154 | B2 | 10/2014 | Ma et al. |
| 9,425,351 | B2 | 8/2016 | Ma et al. |
| 2003/0032253 | A1 | 2/2003 | Nguyen et al. |
| 2004/0164319 | A1 | 8/2004 | Zampardi et al. |
| 2005/0218428 | A1 | 10/2005 | Bahl et al. |
| 2006/0061289 | A1 | 3/2006 | Fujiwara et al. |
| 2006/0121682 | A1 | 6/2006 | Saxler |
| 2008/0277715 | A1 | 11/2008 | Ohmi et al. |
| 2013/0075757 | A1* | 3/2013 | Suzuki .............. H01L 21/02376 257/77 |
| 2014/0145210 | A1* | 5/2014 | Suzuki ................. H01L 21/041 257/77 |
| 2016/0172449 | A1* | 6/2016 | Suzuki ............... H01L 29/1602 257/77 |
| 2016/0204306 | A1* | 7/2016 | Ma ......................... H01L 33/06 257/13 |
| 2017/0372965 | A1* | 12/2017 | Nishibayashi .......... H01L 21/02 |
| 2018/0151715 | A1* | 5/2018 | Chowdhury ........ H01L 29/7725 |
| 2018/0254356 | A1* | 9/2018 | Yao ....................... H01L 31/024 |
| 2019/0013389 | A1* | 1/2019 | Kawashima ............ H01L 21/28 |

OTHER PUBLICATIONS

Chen et al., Epitaxially oriented growth of diamond on silicon by hot filament chemical vapor deposition, Appl. Phys. Lett., vol. 68, No. 2, Jan. 8, 1996, pp. 176-178.
Barnett et al., 50% Efficient Solar Cell Architectures and Designs, Conference Record of the 2006 IEEE 4th World Conference on Photovoltaic Energy Conversion, Waikoloa, HI, May 7-12, 2006, pp. 2560-2564.
International Search Report and Written Opinion issued in PCT/US2014/011569, dated May 20, 2014.
Sque et al., Hydrogenation and oxygenation of the (100) diamond surface and the consequences for transfer doing, phys. Stat.sol. (a), vol. 202, No. 11, pp. 2091-2097, Aug. 3, 2005.
Traore et al., Zr/oxidized diamond interface for high power Schottky diodes, Applied Physics Letters, American Institute of Physics, 104, 2014, pp. 052105-052105/4.
Umezawa et al, Diamond Metal—Semiconductor Field-Effect Transistor With Breakdown Voltage Over 1.5 kV, IEEE Electron Device Letters, vol. 35, No. 11, Nov. 201, pp. 1112-1114.
Kawarada et al, C-H surface diamond field effect transistors for high temperature (400 C) and high voltage (500 V) operation, Applied Physics Letters 105, 013510-1 to 013510-4, 2014.
Xu, D., et al, 0.1 µm Atomic Layer Deposition Al2O3 Passivated InAlN/GaN High Electron-Mobility Transistors for E-Band Power Amplifiers, IEEE Electron Device Letters 36, 442-444 (2015).
Hasegawa, H., et al. Mechanisms of current collapse and gate leakage currents in AlGaN/GaN heterostructure field effect transistors. J. Vac. Sci. Technol., B, 21. 1844-1855, (2003).
Volpe,et al, Extreme dielectric strength in boron doped homoepitaxial diamond, Appl. Phys. Lett. 97, 223501 (2010).
Tsugawa et al, Schottky barrier heights, carrier density, and negative electron affinity of hydrogen-terminated diamond, Phys. Rev. B, 81, 045303 (2010).
Huang et al., High-Voltage Diamond Schottky Rectifiers, International Journal of High Speed Electronics and Systems, vol. 14, No. 3, pp. 872-878, 2004.
Butler et al., Exceptionally high voltage Schottky diamond diodes and low boron doping, Semicond. Sci Technol, 18, pp. S67-S71, 2003.
Gi et al., Hall Effect Measurements of Surface Conductive Layer on Undoped Diamond Films in $NO_2$ and $NH_3$ Atmospheres, Jpn. J. Appl. Phys., vol. 38, pp. 3492-3496, Jun. 1999.
Hayashi, et al., Study of the effect of hydrogen on transport properties in chemical vapor deposited diamond films by Hall measurements, Appl. Phys. Lett. vol. 68, No. 3, Jan. 15, 1996, pp. 376-378.
Iwasaki et al., 600 V Diamond Junction Field-Effect Transistors Operated at 200 degrees, C, IEEE Electron Device Letters, vol. 35, No. 2, Feb. 2014, pp. 241-243.
Kubovic et al., Structural and electrical properties of H-terminated diamond field-effect transistor, Diamond & Related Materials 18, 2009, pp. 796-799.
Kumaresan et al., Vertical structure Schottky barrier diode fabrication using insulating diamond substrate, Diamond & Related Materials 19, 2010, pp. 1324-1329.
Maier et al., Electron affinity of plasma-hydrogenated and chemically oxidized diamond 100 surfaces, Physical Review B, vol. 64, pp. 165411-1 to 165411-7.
Nebel, Christoph E, A source of energetic electrons, Nature Materials vol. 12, pp. 780-781 (2013).
Ristein et al., Diamond surface conductivity experiments and photoelectron spectroscopy, Diamond and Related Materials 10 Ž2001. 416||422.
Teraji et al., Low-leakage p-type diamond Schottky diodes prepared using vacuum ultraviolet light/ozone treatment, Journal of Applied Physics 105, 126109-1 to 126109-3, 2009.
Twitchen et al., High-Voltage Single-Crystal Diamond Diodes, IEEE Transactions on Electron Devices, vol. 51, No. 5, May 2004, pp. 826-828.
Umezawa et al., 1 omega On-Resistance Diamond Vertical-Schottky Barrier Diode Operated at 250 degrees C, Applied Physics Express 6 (2013), pp. 011302-1 to 011302-4.
Zhu et al. Photo-illuminated diamond as a solid-state source of solvated electrons in water for nitrogen reduction, Nature Materials, vol. 12, pp. 836-841, 2013.
Ikeda et al., Fabrication of a field plate structure for diamond Schottky barrier diodes, Diamond and Related Materials, vol. 18, Feb.-Mar. 2009, pp. 292-295.

* cited by examiner

P-N DIODES AND P-N-P HETEROJUNCTION BIPOLAR TRANSISTORS WITH DIAMOND COLLECTORS AND CURRENT TUNNELING LAYERS

REFERENCE TO GOVERNMENT RIGHTS

This invention was made with government support under N00014-18-1-2032 awarded by the NAVY/ONR. The government has certain rights in the invention.

BACKGROUND

Diamond is one of the most desirable wide bandgap materials for next-generation high-power switching devices, as it has superior physical and electrical properties, including a high breakdown electric field, a high thermal conductivity, and a high carrier mobility. With the developments in large-area, single-crystal diamond substrate growth by high-growth-rate chemical vapor deposition (CVD), there has been a steady advance in diamond device studies. However, due to deep donor energy levels, using nitrogen or phosphorous to achieve n-type doping in diamond has been extremely difficult. As a result, diamond-based electronic devices are mostly based on p-type doped diamond.

N-type doping a (001) diamond substrate with phosphorus has been achieved. However, the resistivity of the n-type layer is still high, owing to the deep phosphorus donor levels. Therefore, although p-n-junction diodes (PNDs) based on diamond have shown a high breakdown voltage, they also have a high on-resistance because the non-ohmic metal/n-type diamond contact and n-type doped diamond layer induce high resistance, which is detrimental to obtaining a high-power, low-loss diode. On the other hand, despite p-type diamond's ability to provide a high breakdown voltage for p-type diamond-based Schottky diodes, there exists a trade-off between on-resistance and breakdown voltage. In order to reduce the resistance of the p-type depletion layer, the acceptor concentration needs to be increased, and the resultant depletion region narrowing results in a decrease of the breakdown voltage. (See, e.g., A. Traore, et al., Zr/oxidized diamond interface for high power Schottky diodes, *Appl. Phys. Lett.* 104, 052105 (2014).)

SUMMARY

P-N diodes that include p-type doped diamond ("p-type diamond") and devices, such as p-n-p HBTs, that incorporate the p-n diodes are provided.

One embodiment of a p-n diode includes: (a) a layer of p-type diamond having an upper surface with a positive electron affinity; (b) a layer of a single-crystalline n-type semiconductor material, the single-crystalline semiconductor material having a different lattice constant than the diamond; and (c) a current tunneling layer disposed between and in contact with the upper surface of the diamond and the lower surface of the layer of the single-crystalline n-type semiconductor material. The current tunneling layer comprises an inorganic material having a bandgap that is wider than the bandgaps of the diamond and single-crystalline n-type semiconductor material and the inorganic material is not a native oxide of the single-crystalline n-type semiconductor material.

One embodiment of a heterojunction bipolar transistor includes: (a) a collector comprising a layer of p-type diamond having an upper surface with a positive electron affinity; (b) a base comprising a layer of a single-crystalline n-type semiconductor material, the single-crystalline n-type semiconductor material having a different lattice constant than the diamond; (c) a current tunneling layer disposed between and in contact with the upper surface of the layer of diamond and a lower surface of the layer of the single-crystalline n-type semiconductor material; and (d) an emitter comprising a layer of a single-crystalline p-type semiconductor material. The current tunneling layer comprises an inorganic material having a bandgap that is wider than the bandgaps of the diamond and the single-crystalline n-type semiconductor material and the inorganic material is not a native oxide of the single-crystalline n-type semiconductor material.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 5A, panel (ii) shows the band alignment for a p-n diode having a positive electron affinity p-diamond layer. FIG. 5B, panel (ii) shows the band alignment for the p-n diode of FIG. 5A, panel (ii) under reverse bias with a depletion region extending into the p-diamond. FIG. 5C, panel (ii) shows the I-V characteristics of the p-n diode of FIG. 5A, panel (ii).

FIG. 9A shows the current density-voltage characteristics of a p-Si NM emitter and n-Ge NM base heterojunction diode (E-B junction). FIG. 9B shows current density-voltage characteristics of an n-GeNM base and p-Diamond collector heterojunction diode (C-B junction). FIG. 9C shows the common emitter $I_C$-$V_{CE}$ characteristics of HBTs with 0.5 µA step.

FIG. 10A shows the current gain and differential beta as a function of collector current density with different $V_{CB}$ from 0V to 2V. FIG. 10B depicts the unilateral power gain (U) and maximum stable gain (MSG)/maximum available gain (MAG) as a function of frequency at a bias point of $I_B$ of 0.06 µA and $V_{CB}$ of −5 V. FIG. 9C shows $f_T$ and $f_{max}$ as a function of collector current density.

DETAILED DESCRIPTION

Figure 1A:
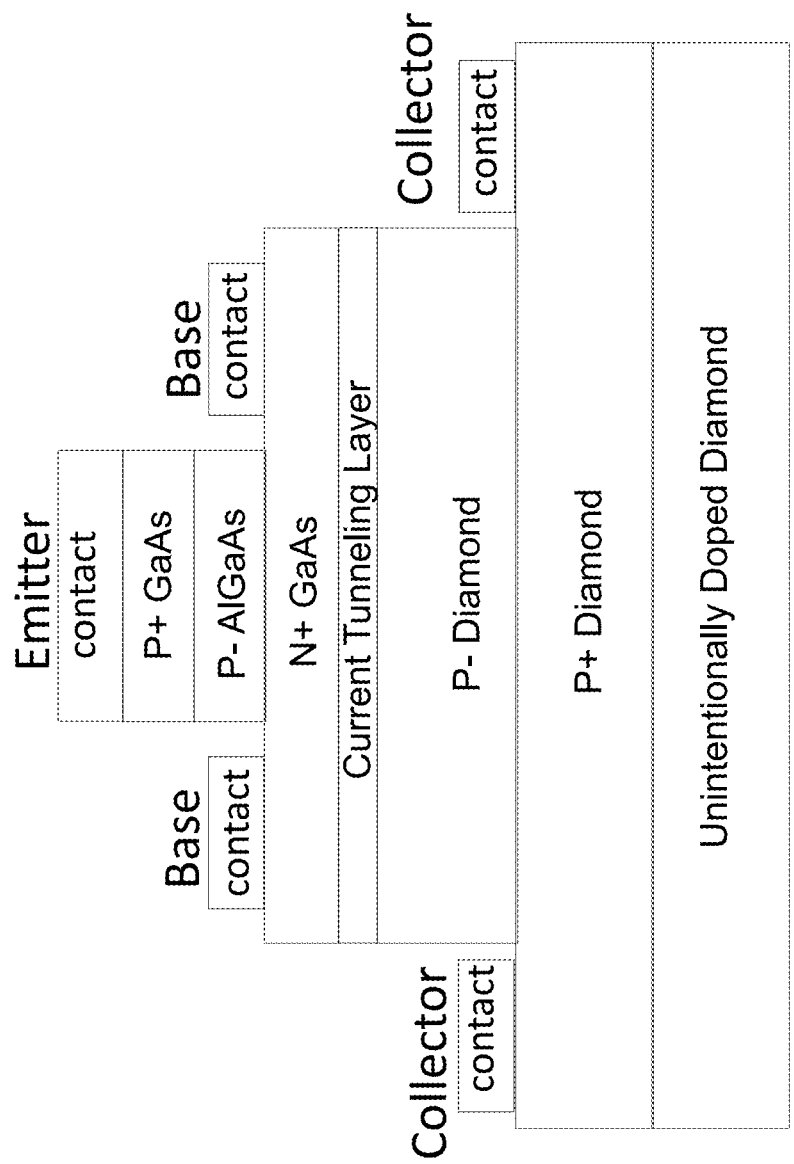
FIG. 1A is a schematic illustration of one embodiment of a diamond-collector heterojunction bipolar transistor (HBT).

P-N diodes that include p-type doped diamond ("p-type diamond") and devices, such as p-n-p HBTs, that incorporate the p-n diodes are provided. In the p-n diodes, the diamond at the p-n junction has a positive electron affinity at the operating temperature of the diode and is passivated by a thin layer of inorganic material that acts as a current tunneling layer and passivates the bonding interface states, without hindering carrier transport across the interface.

The p-n diodes are characterized by high breakdown voltages, low on-resistances, and high Baliga Power Figures of Merit (BFOM). By way of illustration, various embodiments of the p-n diodes have breakdown voltages of at least 10 V at room temperature (25° C.). This includes p-n diodes having a breakdown voltage of at least 100 V at 25° C. and further includes p-n diodes having a breakdown voltage of at least 1000 V at 25° C. In addition, various embodiments of the p-n diodes have a BFOM of 1 GW/cm² or higher. Methods of measuring the breakdown voltage and BFOM for a p-n diode are provided in the Examples.

The electronic surface properties of the diamond in the p-n diodes play an important role in the performance of the diodes and the devices into which they are incorporated because the surface properties affect the electrical conductivity, surface state distributions, and band bending of the p-n junctions. In order to attain the proper band alignment for high-performance p-n diodes, the diamond surface should have a positive electron affinity at the operating temperature of the p-n diode.

In general, a chemical vapor deposition (CVD)-grown diamond substrate, without any surface treatment, has a hydrogen- and oxygen-mixed terminated surface with a negative electron affinity. However, for devices such as HBTs, negative electron affinity is disfavored, since hole accumulation at the diamond surface can shorten the depletion distance into diamond and, therefore, reduce the breakdown voltage of the p-n diode. In order to avoid hole accumulation at the diamond surface, the surface can undergo oxygen treatment to provide the diamond with oxygen termination dominated surface condition and a positive electron affinity. In addition, predominant oxygen termination facilitates the uniform deposition of oxide-based current tunneling layers, such as $Al_2O_3$, which is important for the subsequent transfer and bonding of an n-type semiconductor nanomembrane to complete the p-n diode with a high-quality heterojunction interface.

The diamond in the p-n diodes can be provided with a predominant oxygen-surface termination to exhibit positive electron affinity by exposing it to an oxygen-containing environment under oxidizing conditions. For example, the diamond can be exposed to an oxygen plasma, or exposed to UV in an ozone environment or subjected to an oxidizing chemical treatment at temperatures of, for example, soaking the sample in $H_2SO_4$ and $HNO_3$ at 200° C. for 10 min.

In the HBTs, the positive electron affinity diamond in combination with the surface passivation provides a high base-collector diode breakdown voltage. For an HBT to obtain high current gain, the emitter material should have a larger bandgap than the base material. Examples of emitter/base material combinations that satisfy this criterion include Si/Ge, Si/SiGe, SiGe/Ge and III-V semiconductor pairs, such as AlGaAs/GaAs, GaInP/GaAs, InAlAs/InP, InAlAs/InGaAs and InP/InGaAs.

Figure 1B:
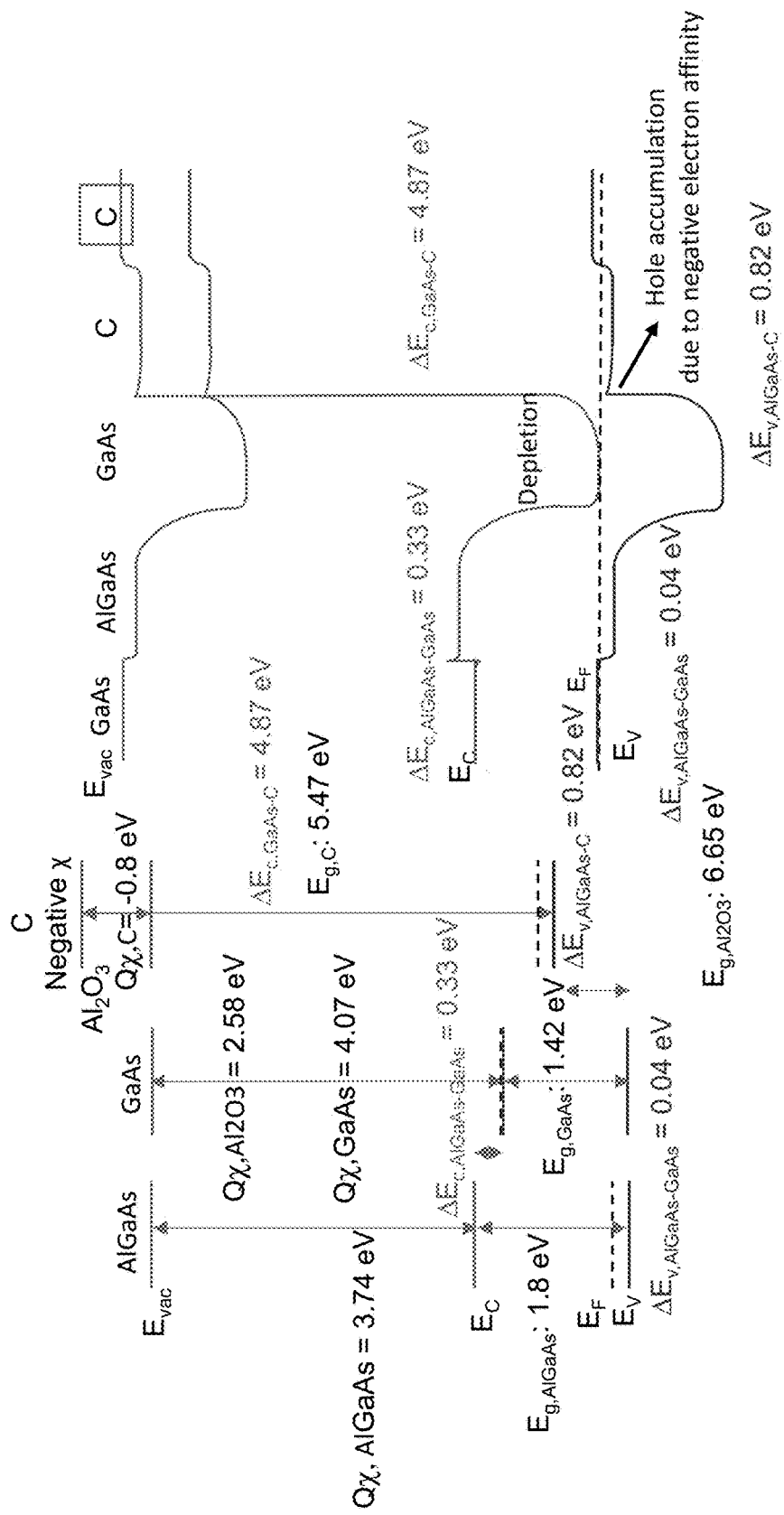
FIG. 1B shows the energy level and band diagrams for the HBT of FIG. 1A with a negative electron affinity ($\chi$) diamond collector.
Figure 1C:
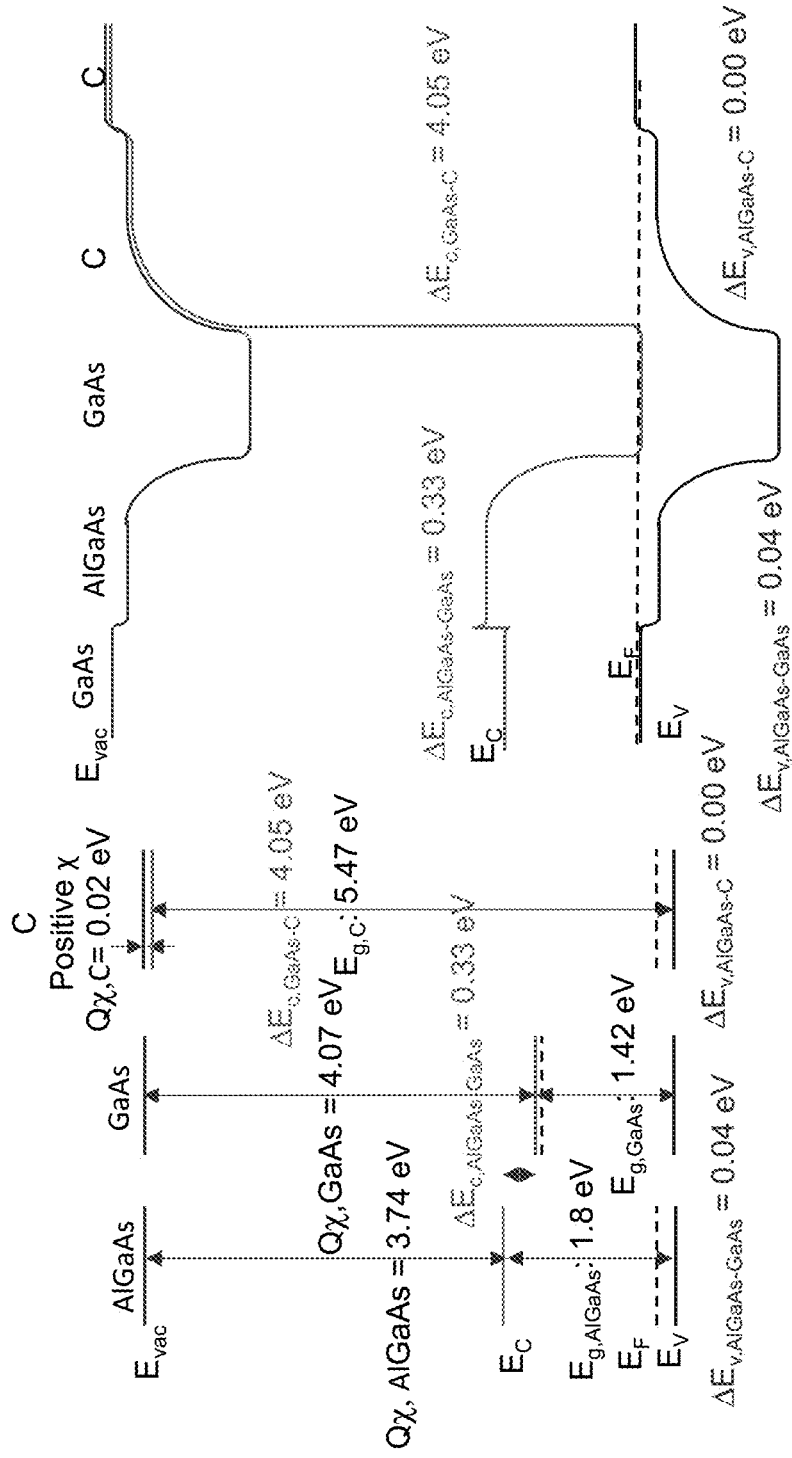
FIG. 1C shows the energy level and band diagrams for the HBT of FIG. 1A with positive electron affinity diamond collector.

The effect of the surface properties on the band diagram for a GaAs-base diamond-collector HBT are illustrated in FIGS. 1A-1C. A cross-sectional view of the HBT is shown in FIG. 1A. The HBT includes an unintentionally doped diamond substrate upon which a p-type diamond collector and a heavily p-type doped (P+) sub-collector are formed. The sub-collector serves to provide good ohmic contact with the collector contact metal and to provide a low resistance current path connecting the moderately p-type doped (P−) diamond layer. An n-type layer of single-crystalline n-type GaAs (a GaAs NM) serves as the base and is separated from the diamond collector by a thin current tunneling layer. The emitter includes a lower, moderately p-type doped AlGaAs layer and an upper, heavily p-type doped GaAs layer (i.e., emitter contact layer) that serves to provide good ohmic contact with the emitter contact metal.

FIG. 1B shows the energy level and band structure diagrams for the various layers in the heterostructure stack (left) and for the heterostructure (right) of FIG. 1A in which the P− diamond (C) has a negative electron affinity. As shown in the band structure diagram, the negative electron affinity results in hole accumulation in the diamond at the GaAs/diamond interface and a depletion region extending into the n-type GaAs base layer under a reverse bias. This limits the breakdown voltage for the base-collector diode and can result in significant leakage current.

FIG. 1C shows the energy level and band structure diagrams for the various layers in the heterostructure stack (left) and for the heterostructure (right) of FIG. 1A in which the P− diamond has positive electron affinity. As shown in the band structure diagram, the positive electron affinity results in a depletion region extending into p-type diamond collector layer under a reverse bias. This increases the breakdown voltage for the base-collector diode and reduces leakage current. The magnitude of the positive electron affinity can be varied with surface termination conditions. The more toward oxygen termination than toward hydrogen termination is on the diamond surface, the large is the positive electron affinity value. The value of the positive electron affinity also affects the valence band alignment between the base and the collector. For operating temperatures in the range from about 25° C. to about 300° C., electron affinities in the range from about 0.02 eV to 0.05 eV would be sufficient.

Figure 2A:
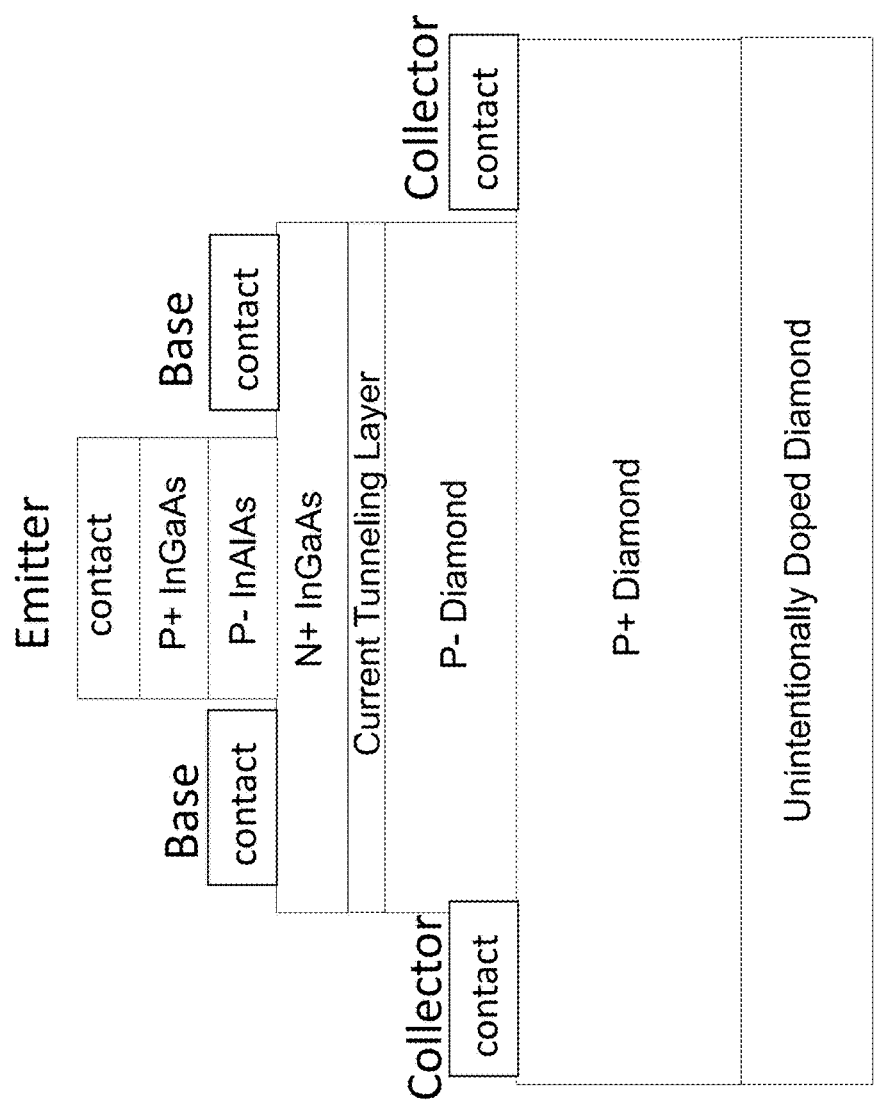
FIG. 2A is a schematic illustration of another embodiment of a diamond-collector HBT.
Figure 2B:
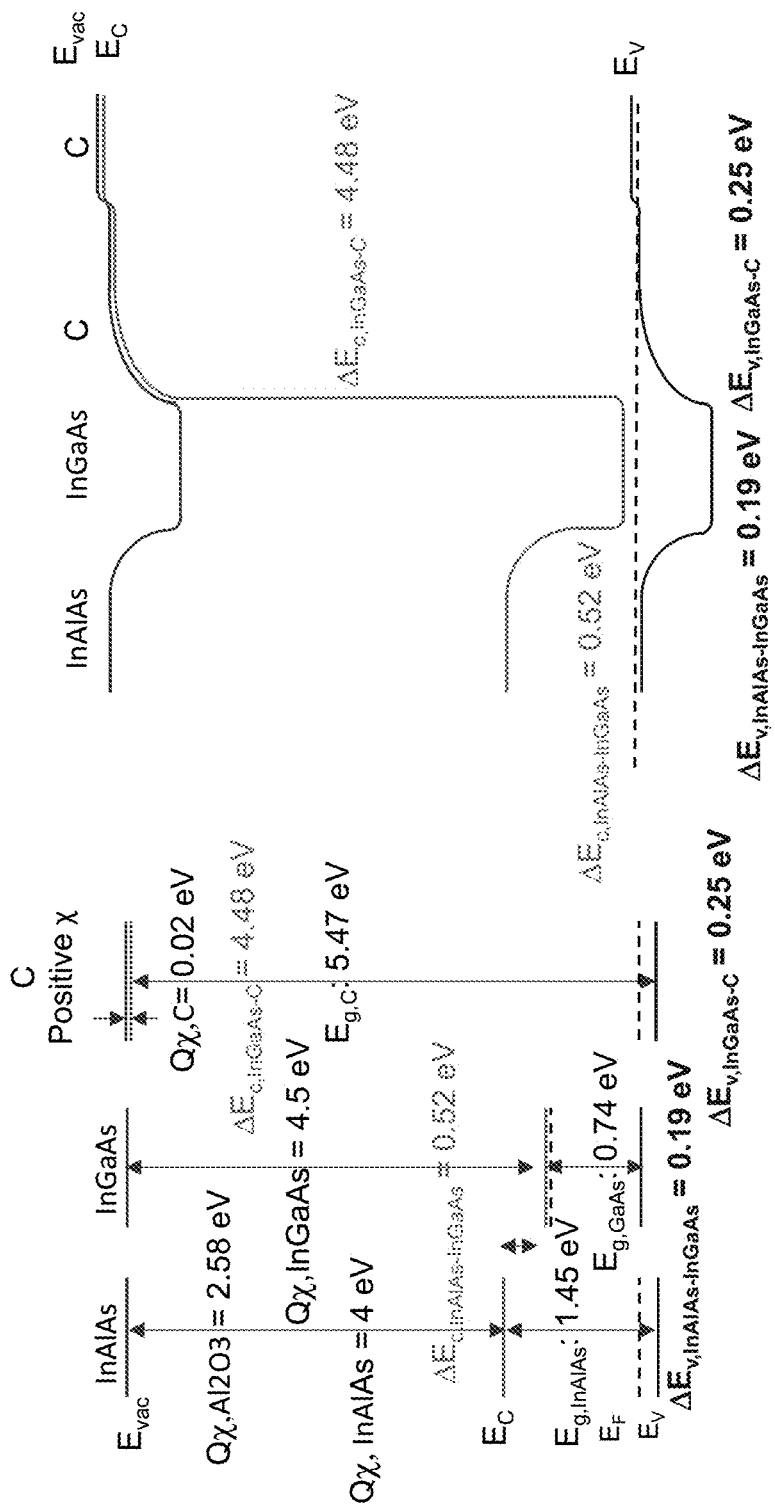
FIG. 2B shows the energy level and band diagrams for the HBT of FIG. 2A with a positive electron affinity diamond collector.

FIGS. 2A and 2B show the structure and energy band diagrams, respectively, for another embodiment of a diamond-collector HBT having a positive electron affinity. This HBT includes an unintentionally doped diamond substrate upon which a p-type diamond collector and a heavily p-type doped (P+) diamond sub-collector are formed. The sub-collector serves to provide good ohmic contact with the collector contact metal and a low-resistance current path connecting the moderately p-type doped (P−) diamond layer. An n-type layer of single-crystalline n-type InGaAs (an InGaAs NM) serves as the base and is separated from the diamond collector by a thin current tunneling layer. The emitter includes a lower, moderately p-type doped InAlAs layer and an upper, heavily p-type doped InGaAs layer (emitter contact) that serves to provide good ohmic contact with the emitter contact metal.

The p-n diodes can be fabricated using a membrane transfer and bonding process that allows the material of the n-type layer to be selected independently from material of the p-type layer. Thus, the transfer and bonding process enables the integration of a large variety of different semiconductor materials into the p-n diodes and devices that incorporate the p-n diodes.

Figure 3:
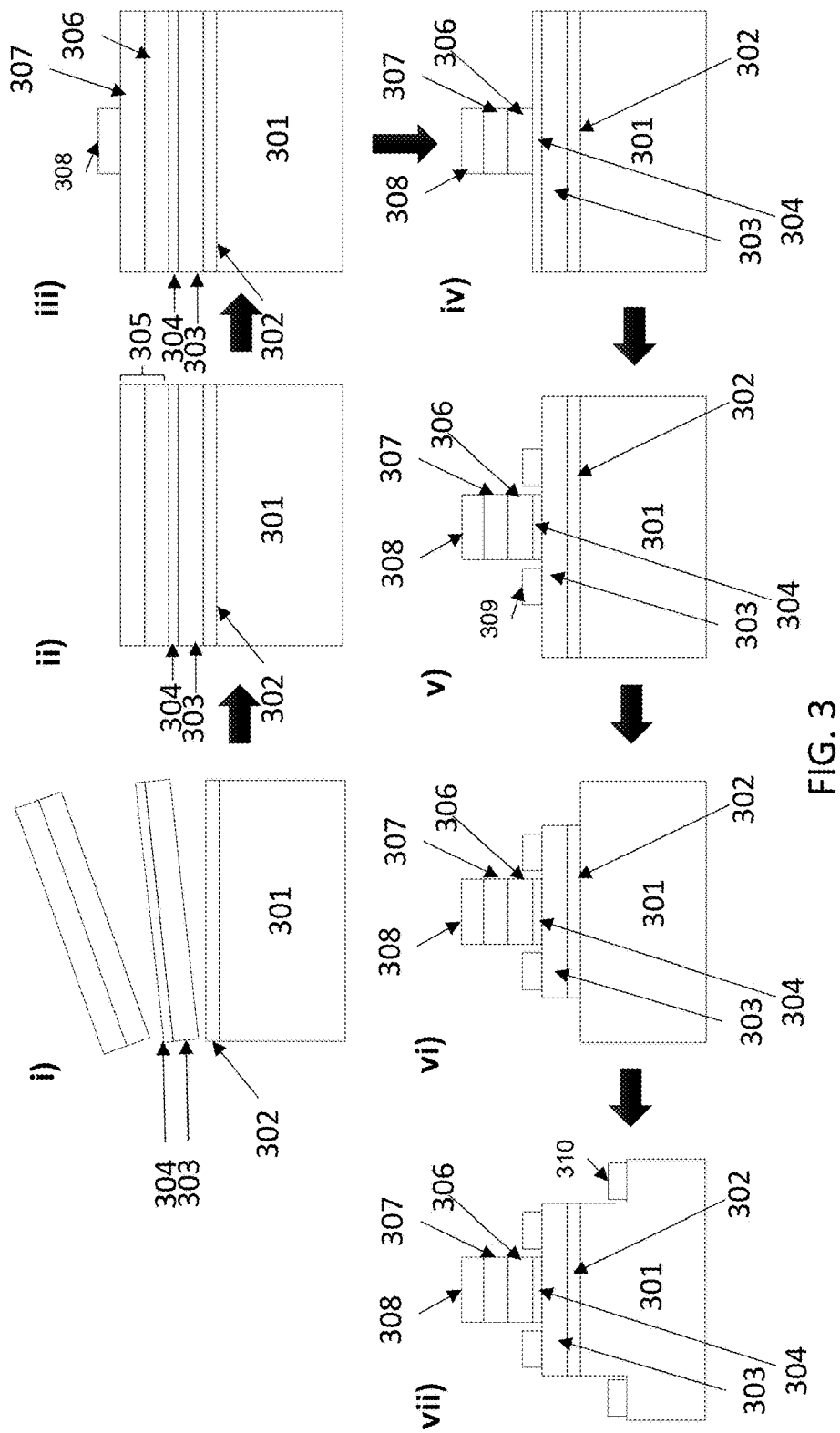
FIG. 3 is a schematic diagram showing a method of fabricating a diamond-collector HBT using a nanomembrane transfer and bonding process.

One embodiment of a method for forming an HBT is shown schematically in FIG. 3. The structure is built on a p-type diamond collector 301 (panel (i)) having an upper surface that has been treated to provide the diamond with a positive electron affinity at the intended operating temperature of the base-collector diode. This can be accomplished using an oxygen treatment to provide the upper surface of diamond collector 301 with predominantly oxygen surface termination, as illustrated in the Examples. Upon the upper surface of oxygen-terminated collector 301, a current tunneling layer 302 is deposited. The thickness of the current tunneling layer typically need only be on the order of the root mean square (rms) roughness of the surfaces of the layers of semiconductor material which it binds. By way of illustration, in some embodiments, the current tunneling layer has a thickness in the range from about 0.5 nm to about 10 nm. This includes embodiments in which it has a thickness in the range from about 0.5 nm to about 5 nm or from about 0.5 nm to about 3 nm. Since the thickness of the current tunneling layer may not be uniform on an atomic scale, the thickness of the layer corresponds to the average thickness of the layer across the bonding interfaces of the heterostructure.

Once current tunneling layer 302 has been deposited, a thin layer of pre-formed, single-crystalline, n-type doped semiconductor material (referred to as a semiconductor nanomembrane; abbreviated "NM") can be transferred onto its upper surface to provide the base layer 303 of the HBT, as shown in panel (i) of FIG. 3. This can be achieved using a NM transfer and bonding process, as illustrated in the Examples. As shown in FIG. 3, base layer 303 may optionally have a second current tunneling layer 304 deposited onto its upper surface. Next, a p-type doped semiconductor NM is transferred onto, and bonded to, base layer 303 to provide the HBT emitter 305. In the embodiment of FIG. 3, emitter 305 includes a lower layer of moderately p-type doped semiconductor material 306 and an upper layer of heavily p-type doped semiconductor material 307. The bonding of the transferred semiconductor NMs can be enhanced by annealing (panel (ii)). An emitter metal stack 308 can then be deposited on emitter 305 (panel (iii)).

Next, a base mesa is etched through the heterostructure down to base layer 303 (panel (iv)) and a base metal stack 309 is deposited using, for example, metallization (panel (v)). A collector mesa in then etched down to diamond collector 301 and a collector metal stack 310 is deposited using, for example, metallization (panel (vii)).

The method of transferring the pre-formed single-crystalline semiconductor layers (i.e., the NMs) onto the heterostructure can be carried out starting with a semiconductor-on-insulator substrate comprised of a handle wafer, a sacrificial layer, such as a buried oxide layer, and a thin layer of the single-crystalline semiconductor, such as a thin layer of single-crystalline Ge, Si, SiGe or III-Vs. The transferring of III-V NMs can also be carried out starting with epitaxial layers such as AlGaAs/GaAs, GaInP/GaAs, InAlAs/InP, InAlAs/InGaAs and InP/InGaAs that are grown on proper sacrificial epitaxial layers. The sacrificial layer is then selectively removed from the structure. This can be carried out, for example, by forming an array of holes (apertures) through the thin layer of single-crystalline semiconductor and then selectively chemically etching away the sacrificial layer that is exposed through the apertures. These apertures may be regularly spaced, or randomly spaced. As a result, the thin layer of single-crystalline semiconductor settles onto the underlying handle wafer. A host material, such as a rubber stamp, is then pressed onto the upper surface of the released layer of the single-crystalline semiconductor, which adheres to the host material and is lifted away from the handle wafer. In a subsequent step the released layer of single-crystalline semiconductor is brought into contact with, and transferred onto, the current tunneling layer. The single-crystalline layer can be doped before or after transfer and bonding. The host material is then removed. A more detailed description of this type of transfer and bonding process can be found in U.S. patent publication number 2016/0204306.

The etch chemistry used for the release of a given semiconductor NM will depend on the sacrificial layer from which it is being released. However, semiconductor selective etchants are known for a variety of semiconductor materials. For example, layers of Si, Ge, or SiGe can be released from a buried $SiO_2$ or $GeO_2$ layer using a hydrofluoric acid (HF) etch; layers of GaAs and AlGaAs can be released from a buried AlGaAs sacrificial layer using HF. (In the case of an AlGaAs device layer, the AlGaAs sacrificial layer would have a higher aluminum content.) A GaAs layer can be released from a sacrificial GaAsN layer using aqueous NaOH, and an InGaAsP layer can be released from a sacrificial InGaAs layer using an $HF:H_2O_2:H_2O$ etch. AlGaAs with a high aluminum content can be released from GaAs using a citric acid:$H_2O_2$:$H_2O$ etch. However, other known selective etch chemistries can be used.

An alternative method of transferring a single-crystalline semiconductor layer onto a heterostructure uses wafer bonding followed by hydrogen implantation to create a splitting plane in the semiconductor material—a technique that is sometimes referred to as Smart Cut. A description of the Smart Cut process can be found in Bruel et al., *Proceedings 1995 IEEE International SOI Conference,* 178 (1995). In this technique, a buried hydrogen implantation layer is formed in a semiconductor substrate, such as a semiconductor wafer. The depth of hydrogen implantation layer will determine the thickness of the single-crystalline semiconductor layer (i.e., NM) to be transferred. Once the splitting plane is formed via hydrogen implantation, the surface of substrate is contacted with the heterostructure. The substrate is then split at the hydrogen implantation layer and the bulk of the substrate is removed. Optionally, the single-crystalline semiconductor layer may be thinned using a post-transfer chemical mechanical polish.

The current tunneling layer is an ultra-thin but highly conductive layer disposed between the p-type diamond and the n-type semiconductor layer that make up the p-n junction of the diode. Optionally, additional current tunneling layers can be disposed between the semiconductor layers that make up other junctions in the devices. For example, an additional current tunneling layer can be deposited between the p-type emitter and the n-type base of a p-n-p HBT.

The current tunneling layer is formed of an inorganic material having a bandgap that is wider that the bandgaps of the p-type material and the n-type material that make up the p-n diodes. Current tunneling layers are characterized in that they are made from an appropriate material and are sufficiently thin that they are able to act as tunneling layers for electrons and/or holes. That is, unlike a typical dielectric medium, they allow both electrons and holes to pass through, from a first layer to a second layer of semiconductor material, via quantum tunneling. Thus, because metals would block the passage of holes, metals are not suitable materials for a current tunneling layer. However, a wide range of non-metal inorganic materials can meet these criteria. The inorganic material of the current tunneling layer may be a material that would act as a dielectric in its bulk form but is sufficiently thin that it no longer acts as an electrical insulator. This intervening layer of inorganic material passivates the surfaces of the p-type and n-type layers of the p-n diode with which it is in contact, such that dangling bonds and interface states are minimized or substantially reduced. This property is useful because, when directly bonding two non-lattice matched single-crystalline materials, the chemical bonds formed between the two materials can create a large number of interface states. These interface states prevent the two materials from forming an ideal rectifying junction. However, when the inorganic material is inserted, the two materials are physically separated. If the layer is sufficiently thin and has the capability to chemically passivate the materials, the number of interface states can be reduced to levels such that both electrons and holes can efficiently tunnel through the layer. The inorganic layer also provides a sort of 'glue' between the layers of the p-n diodes or other layers in an HBT. In addition, the inorganic layer can prevent the interdiffusion of the semiconductor materials between the layers of the p-n diodes. This avoids the formation of an unwanted, intervening, cross-contaminated semiconductor interface layer.

In some embodiments, the inorganic material of the current tunneling layer is an oxide. In such embodiments, the oxide can comprise, consist of, or consist essentially of, a metal oxide, an oxide of a semiconductor element, and/or an oxide of a metalloid element. Examples of oxides that may be used in metal oxide quantum tunneling layers include, but are not limited to, those that can be deposited via ALD. Examples of such oxides include aluminum oxide ($Al_2O_3$), titanium oxide ($TiO_2$), hafnium oxide ($HfO_2$), tantalum oxide ($Ta_2O_5$), and silicon dioxide ($SiO_2$). In some embodiments, the metal, semiconductor, or metalloid elements present in the oxide are different from any metal, semiconductor or metalloid elements in the other semiconductor layers with which they are in contact and between which they are disposed. In embodiments of the current tunneling layers, the inorganic oxide is not a native oxide of the single-crystalline n-type semiconductor material or the p-type semiconductor of the p-n diode. (As used herein, the term native oxide refers to an oxide that would be monolithically formed on the semiconductor material as the result of the oxidation of the material in an oxygen-containing environment. For example, $SiO_2$ is a native oxide of Si.)

In other embodiments, the inorganic material of the current tunneling layer is a nitride. In such embodiments, the nitride can comprise, consist of, or consist essentially of, a metal nitride, a nitride of a semiconductor element, and/or a nitride of a metalloid element. Examples of nitrides that may be used in nitride current tunneling layers include, but are not limited to, those that can be deposited via ALD. Examples of such nitrides include aluminum nitride, silicon nitride, and titanium nitride. In some embodiments, the metal, semiconductor or metalloid elements present in the nitride are different from any metal, semiconductor or metalloid elements in the semiconductor layers with which they are in contact and between which they are disposed.

In some embodiments, the current tunneling layer comprises two or more sub-layers, each of which comprises an inorganic material, provided, however, that the total combined thickness of the sub-layers is still low enough to allow for the tunneling of electrons and holes through the layer. For example, in a current tunneling layer comprising multiple sub-layers of inorganic oxides, the inorganic oxides can be selected such that one oxide passivates one of the two neighboring semiconductor materials of a p-n diode, while another oxide passivates the other of the two neighboring semiconductor materials.

EXAMPLES

Example 1: GaAs/Diamond Diode

This example illustrates a p-n diode implemented by adopting a heavily doped n-type GaAs layer heterogeneously integrated with a p−/p+ type diamond substrate. Enabled by the nanomembrane (NM) lift-off technique, a GaAs NM was transferred onto a predominantly oxygenated (100) oriented surface of a stack comprising an optimized, lightly boron doped diamond layer on a heavily boron doped diamond layer. Ohmic contacts were formed on both a top n-GaAs layer and a bottom p+ diamond layer, which were laterally separated. To prevent reverse leakage current and lowering of the breakdown voltage, suppressing defects in the depletion region and the interface between the diamond and the GaAs in the heterogeneous structure is critical for device performance. It is known that $Al_2O_3$ can effectively passivate the surface dangling bonds, and thus significantly reduce the leakage current on Group IV and Group III-V materials. A high quality $Al_2O_3$ layer formed by ALD provided an ultra-thin but highly conductive layer between two single crystalline semiconductor materials. Here, the $Al_2O_3$ layer was employed to obtain a high-quality, well-conductive interface with passivated surface states. Predominant oxygen termination of the diamond was also shown to affect breakdown voltage. A control experiment study was carried out comparing the electrical performances of the diodes formed by the predominantly hydrogen-terminated and predominantly oxygen-terminated diamond. As a result, high forward current density of 2800 A/$cm^2$ (at 6 V) and a breakdown voltage of ~1K (field reached larger than 7.7 MV/cm) for p-n diodes with predominantly oxygen terminated diamond were achieved. The power figure of merit (BFOM) is above 1.25 GW/$cm^2$.

Figure 4A:
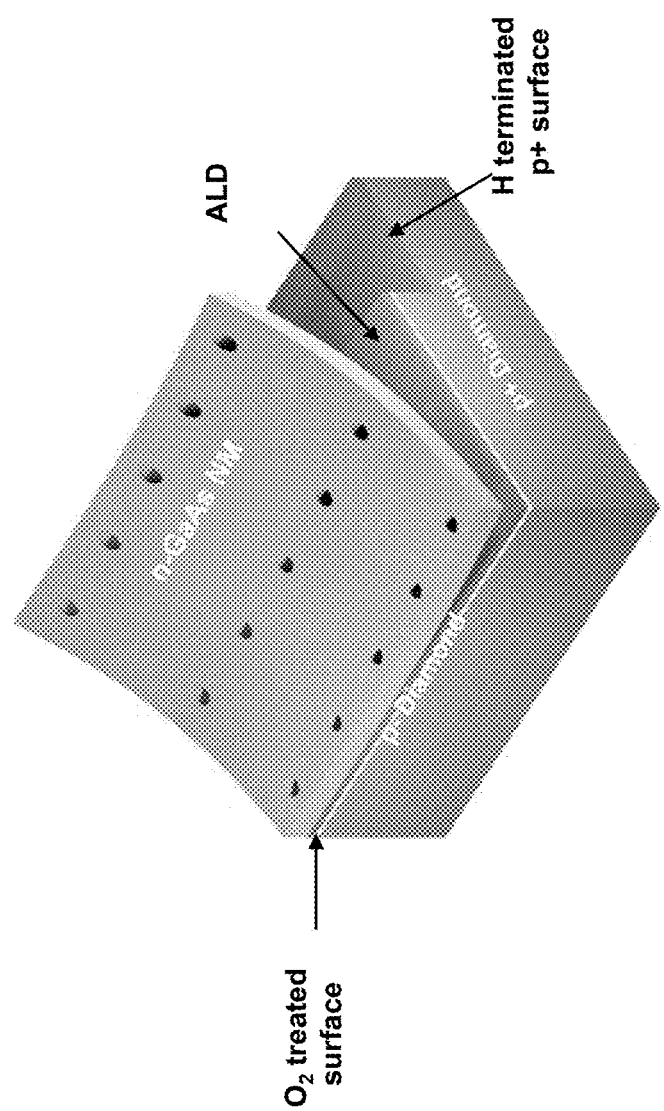
FIG. 4A shows a n-type doped GaAs nanomembrane being transferred onto an Atomic Layer Deposition (ALD)-deposited current tunneling layer to form a p-n diode.
Figure 4B:
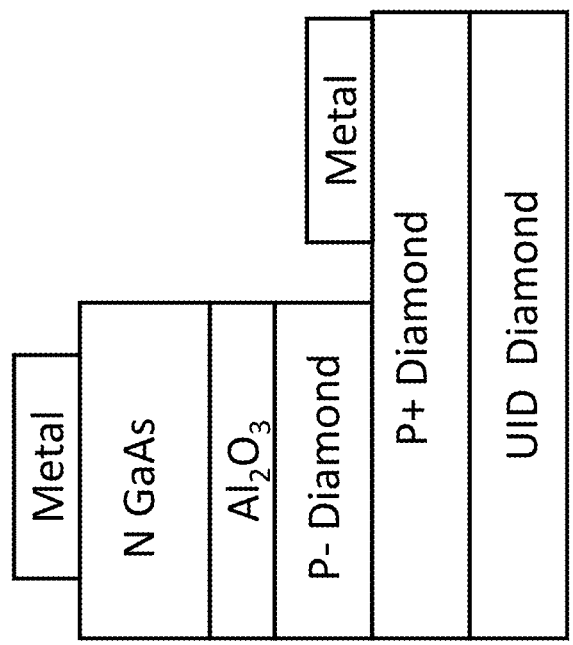
FIG. 4B shows a schematic cross-sectional view of the diode structure.

FIG. 4A shows a n-type doped GaAs nanomembrane being transferred onto an Atomic Layer Deposition (ALD)- deposited current tunneling layer to form a p-n diode. FIG. 4B shows the schematic structure of a GaAs/diamond diode, comprising a top layer of n+/n– GaAs NM, a p–/p+ diamond substrate, and an ultrathin (0.5 nm) $Al_2O_3$ layer in between. The diodes were fabricated on a diamond substrate with arrays of p (Pd/Ge/Au) and n (Ti/Pt/Au) contacts, respectively. The p-doped diamond was deposited using a MPECVD system from ARIOS Inc. using a mixture of $CH_4$ and $H_2$ gas on high-pressure and a high-temperature (HPHT) synthetic IIb (111) single-crystal diamond substrate (2×2× 0.28 $mm^3$) with a misorientation angle of approximately 8°. The following process parameters were used for deposition: 400 W for input microwave power, 20 kPa (150 Torr) total gas pressure, 300 sccm $H_2$ gas flow, 0.1% $CH_4/H_2$ ratio, 960° C. to 970° C. substrate temperature, and 30 min deposition time. To decrease the impurity concentration, $O_2$ (O/C ratio: 2) was used for deposition of the lightly p-doped layer. After deposition, the sample was kept in a mixture of $H_2SO_4$ and $HNO_3$ at 200° C. for 10 min both to remove any surface contamination and to terminate the surface with oxygen. The contact angle measurements were employed to examine the oxygen termination before and after the surface treatment. As the diamond surface termination changes from predominantly carbon-hydrogen bonding to predominantly carbon-oxygen bonding, the surface wettability is enhanced, resulting in a reduced contact angle. The corresponding values of the contact angle before and after oxygen treatment are $\theta$=65.7° and 17.7°, which are typical angle values for hydrogen termination and oxygen termination, respectively. (See, e.g., J. O. Hansen, et al., *J. Colloid. Interface Sci.*, 130 (1989), p. 347.) In order to enable study of the effect on the diodes' performances, subsequent diode formation steps were taken on the diamond sample for the two types of surface termination.

NM Transfer Process

The GaAs NM with a n+ GaAs contact layer on top and an n– GaAs layer at bottom were grown on top of a sacrificial $Al_{0.95}Ga_{0.05}As$ layer on a GaAs substrate by MOCVD. The wafer was then patterned with holes by inductive coupled plasma (ICP) etching to expose the $Al_{0.95}Ga_{0.05}As$ layer. The n+/n– GaAs structure was lifted off by undercutting the sacrificial layer with hydrofluoric acid (HF). The GaAs NMs were then transferred onto the diamond substrate using a print-transfer method without any adhesive or bonding agents. To further strengthen the bonding, the diodes were annealed in nitrogen ambient at a temperature in the range of 200° C. to 500° C. The GaAs NM remained conformal to the diamond surface after annealing. Transmission electron microscopy images of the cross section of the bonded GaAs/diamond heterojunction showed an oxide layer between the single crystal GaAs and the diamond, which effectively passivated the surface states for both sides of the diodes.

Diode Fabrications

For the diodes fabrication, the individual devices were mesa isolated by etching down the GaAs NM and p– diamond layer and stopping at the p+ diamond substrate. Anode contact on the p+ substrate was formed from Ti/Pt/Au (50 nm/50 nm/150 nm) deposited using E-beam evaporation, and a Pd/Ge/Au metal stack was adopted for the cathode contact with the n+ GaAs layer. To ensure good ohmic contact for the p+ diamond, a hydrogen plasma treatment was applied to the exposed p+ region to increase the surface conductivity. The fabricated device area was 60 μm×60 μm for square diodes. Once the diode devices were finished, oxygen plasma with 50 W and 30 seconds was applied on the entire sample, during which all the exposed diamond area was treated, changing the surface bonds from carbon-hydrogen (due to the hydrogen plasma treatment for the p+ contact) to carbon-oxygen termination.

Figure 5A:
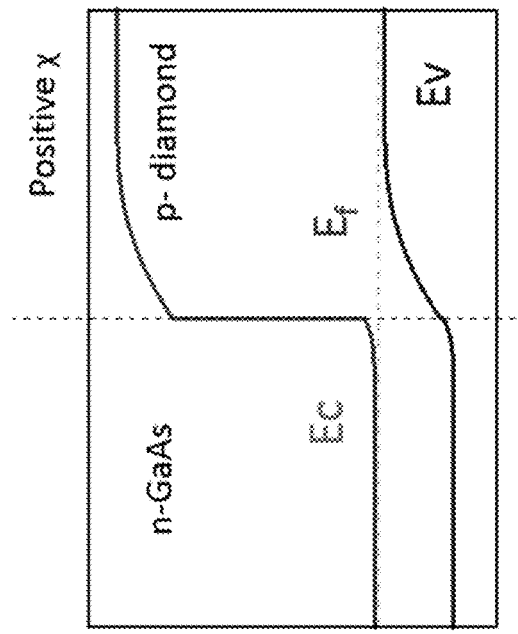
FIG. 5A, panel (i) shows the band alignment for a p-n diode having a negative electron affinity p-diamond layer.
Figure 5A:
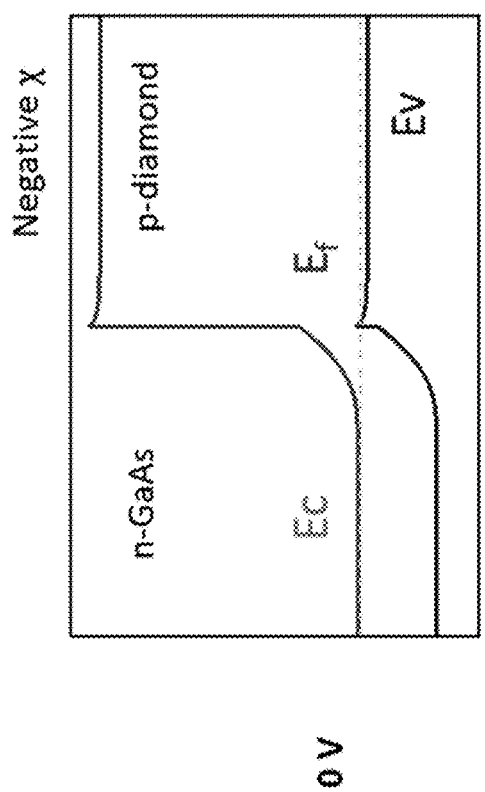
Figure 5B:
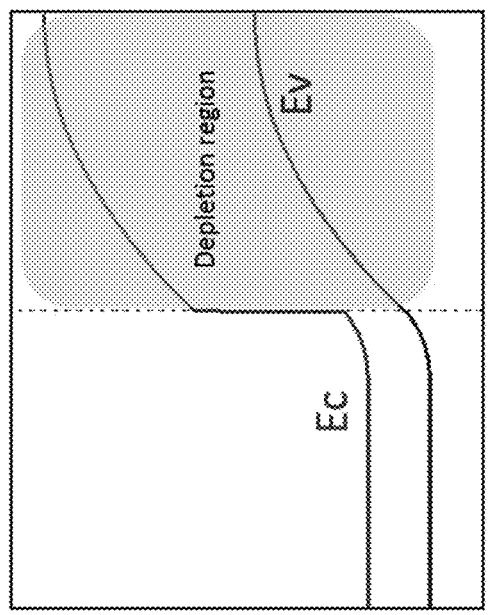
FIG. 5B, panel (i) shows the band alignment for the p-n diode of FIG. 5A, panel (i) under reverse bias with a depletion region extending into the n-GaAs.
Figure 5B:
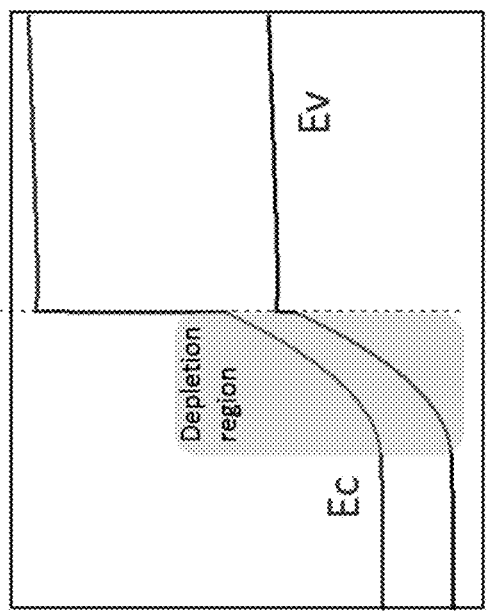
Figure 5C:
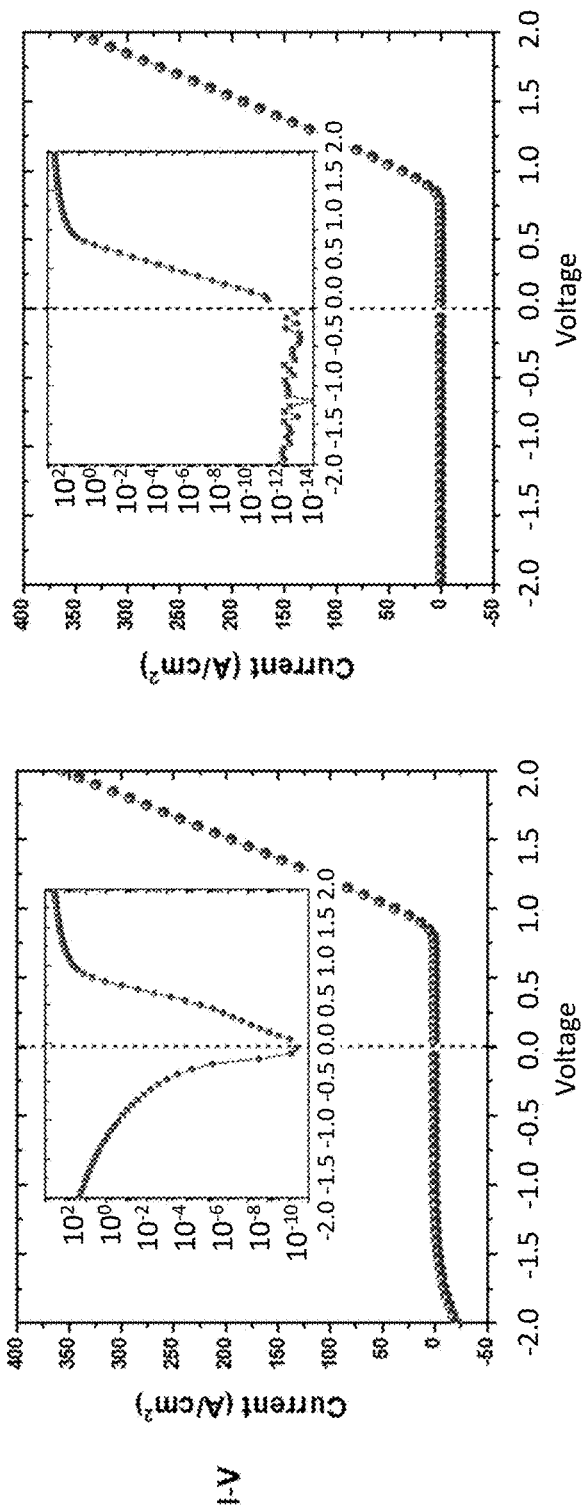
FIG. 5C, panel (i) shows the I-V characteristics of the p-n diode of FIG. 5A, panel (i).

Simulations on the Effects of Diamond Surface Termination on the Diode Electric Characteristics To illustrate the role of a predominantly oxygen terminated diamond surface in order to achieve a high breakdown voltage p-n diode, the band alignments and electrical characterization for the GaAs/diamond diodes were simulated with varied electron affinities, accompanied by different surface treatments. Predominantly hydrogen terminated diamond could induce a negative electron affinity with free electron emission to air, and result in a hole accumulation layer at the surface. On the other hand, predominant oxygen termination modified the electron affinity to a positive value, which varied depending on the ratio of coverage of the oxygen-carbon bonds. In the simulation, electron affinities of –0.5 and 0.2 were adopted for the predominant hydrogen and the predominant oxygen terminated diamond surface, respectively. The doping concentrations for the GaAs and diamond layers were 1E19 and $1E17/cm^3$, respectively. As shown in FIG. 5A(i), due to the negative electron affinity, a hole accumulation region near the diamond surface existed, with the resultant band up-bending for the diamond. In addition, the built-in electric field was located on the GaAs side rather than the diamond side, despite the two orders magnitude lower doping concentration of diamond. In contrast, the built-in voltage was primarily dropped in the diamond for the GaAs/diamond diode with positive electron affinity as shown in FIG. 5A(ii). Furthermore, when a reverse bias of –2V was applied, as illustrated in FIGS. 5B(i) and 5B(ii), the depletion region extended within the GaAs for the diamond diode with negative electron affinity (FIG. 5B(i)); whereas for the diamond with positive electron affinity (FIG. 5B(ii)), the applied electric filed was primarily distributed in the diamond, resulting in a much wider depletion width due to the lower doping concentration. It was essential that the depletion and high electric field occur in the diamond in order to realize a high breakdown voltage. Otherwise, as shown in FIG. 5C(i), the leakage current would be significant compared to that shown in FIG. 5C(ii) if the depletion region mostly resides in the GaAs region, which is attributed to band-to-band tunneling when the valence band of the diamond is higher than the conduction band of the GaAs.

Results and Discussion

Comparison of Current Density-Voltage Curves

Figures 6A, 6B:
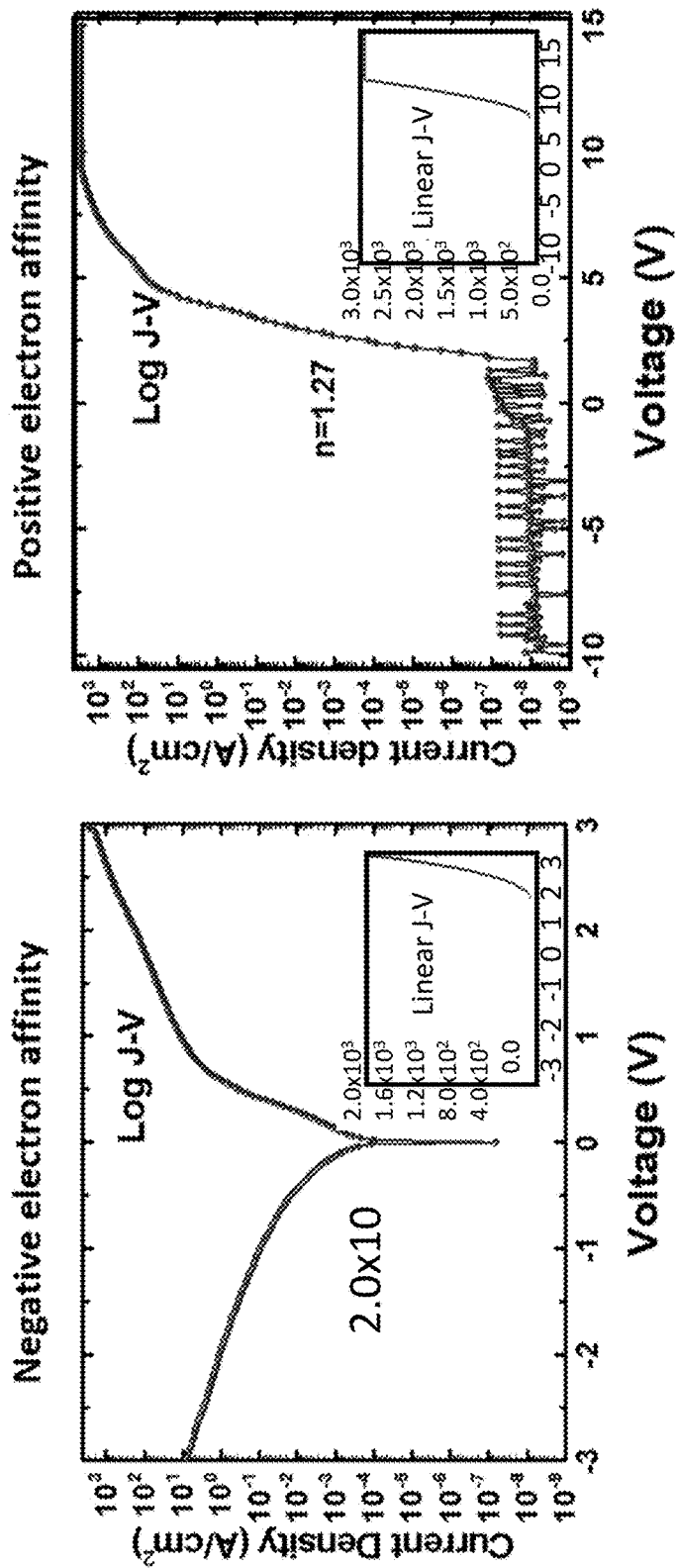
FIG. 6A shows the current density-voltage (J-V) characteristics of a diamond p-n diode with a negative electron affinity diamond at room temperature in air.
FIG. 6B shows the J-V characteristics of a diamond p-n diode with a positive electron affinity diamond at room temperature in air.
Figure 7A:
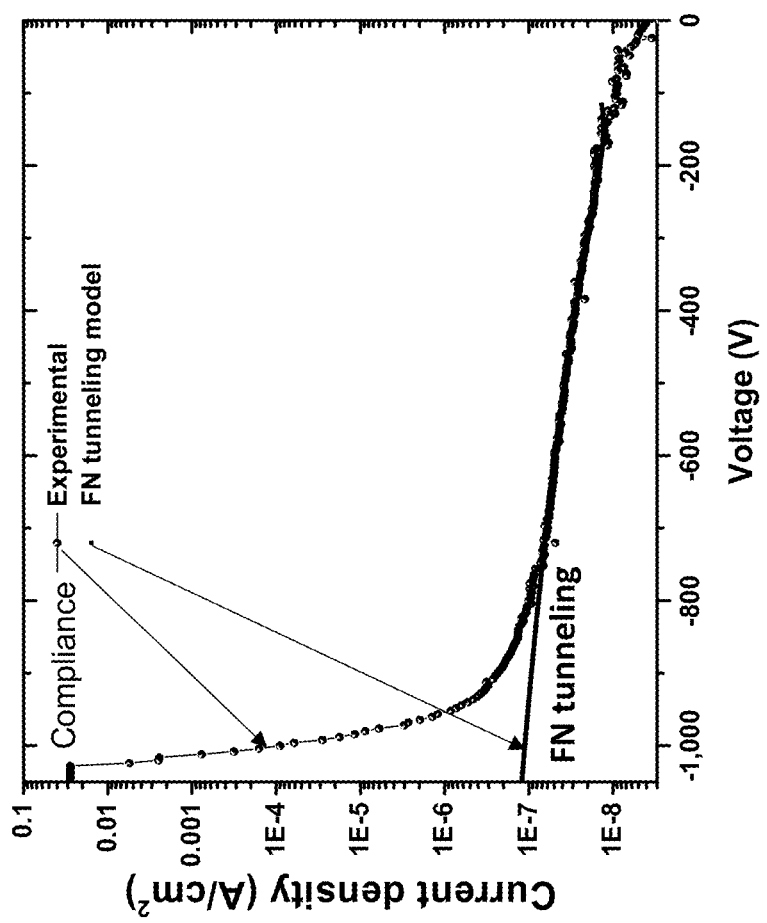
FIG. 7A shows the current density-voltage characteristics in semi-logarithm scale for the GaAs/diamond n-p diode of FIG. 5A, panel (ii) having an electrode area of 60 µm×60 µm under reverse voltage conditions at room temperature in air.
Figure 7C:
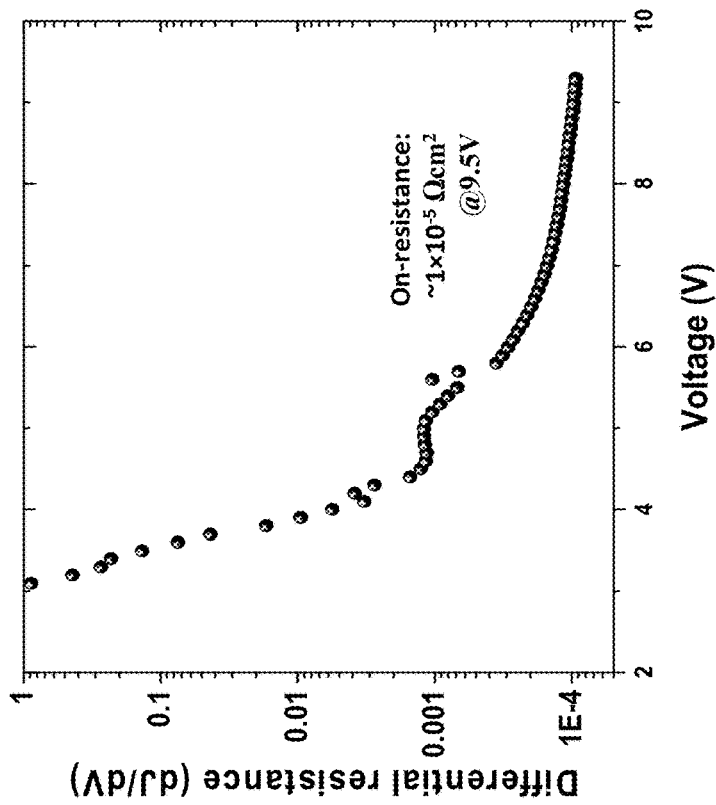
FIG. 7C shows the differential resistance for the diamond estimated using dV/dJ.
Figure 7B:
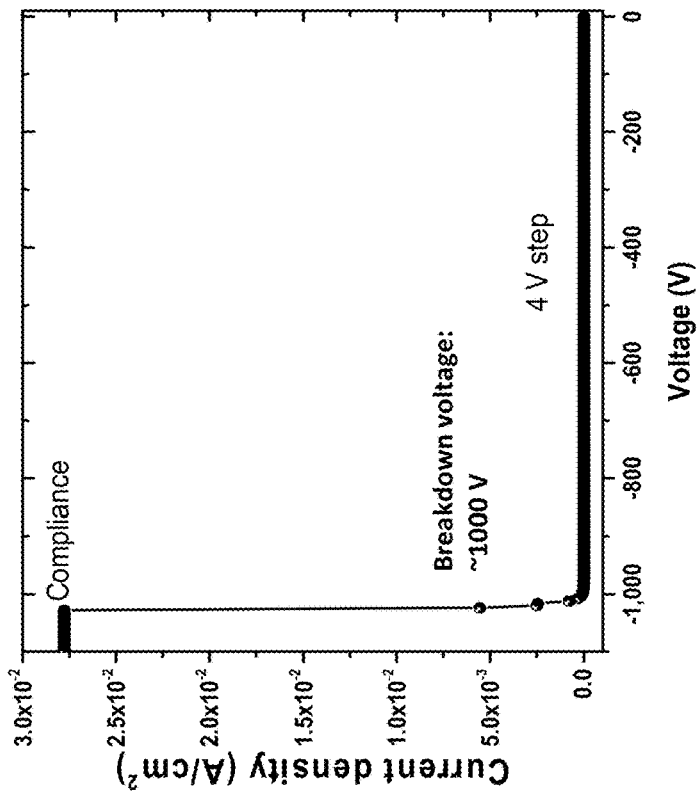
FIG. 7B shows a linear scale plot of the breakdown voltage for the GaAs/diamond n-p diode of FIG. 5A, panel (ii).

FIGS. 6A and 6B show the typical current density-voltage (J-V) characteristics of the two types of diamond diodes with different surface terminations at room temperature (RT) in air. As predicted, the J-V curve for the diode with predominantly hydrogen terminated diamond (in the log scale in FIG. 6A, and the linear scale for the inset) exhibited significantly higher leakage reverse current compared to the J-V curve with a predominantly oxygen terminated surface (FIG. 6B). In contrast, the GaAs/diamond heterojunction with positive electron affinity showed clear diode properties, with a rectification ratio greater than $10^{11}$ at ±8 V, and forward current density of greater than 2800 $A/cm^2$ at a forward DC voltage of approximately 8 V. The corresponding total current was 106 mA with an electrode of 60 μm×60 μm. Furthermore, the ideality factor 11 fell as low as 1.27, indicating a diffusion-dominated current. This suggests 1): good crystalline quality with low concentrations of defects as non-radioactive recombination centers; (2) suppressed interface defects states between the GaAs NM and the diamond, which would also contribute to the non-radioactive recombination induced current (η=2); and 3) a low parasitic leakage path and relatively small series resistance.
Breakdown Characteristics and Mechanisms FIG. 7A shows the typical leakage current density-voltage characteristics in semi-logarithm scale for the GaAs/diamond heterojunction with an electrode of 60 μm×60 under reverse voltage conditions at RT in air. The leakage current had a linear relationship with the bias voltage up to around 800V, which indicates a Fowler-Nordheim dominated tunneling process through the p-n diode under high reverse bias might be responsible for the leakage current. The linear scale plot (FIG. 7B) shows that the breakdown voltage reached as high as 1 kV. During the measurement, neither an indentation mark nor breakage appeared on the electrodes after multiple electrical measurements using tungsten microprobes. The breakdown electric field of the diamond p-n diode reached approximately 3.3 MV/cm, calculated by dividing the breakdown voltage by the estimated p-type diamond layer thickness of 3 μm. The temperature-dependent reverse-bias I-V was measured on the diodes. In the higher bias region, the reverse leakage current changed from temperature-dependent to temperature-independent when the bias voltage was increased. BV increased with increasing temperatures. The positive coefficient of BV versus temperature is a signature of avalanche breakdown, which is desired for reliable device operation for high power applications.
Series Resistance Origins and BFOM Estimation FIG. 7C shows the differential resistance of the diamond estimated using dV/dJ. The differential resistance was 0.08 mΩcm² at a forward voltage of approximately 8 V, corresponding to a resistance of 12.5Ω. The resistance originates mainly from four factors: 1) p diamond metal contact; 2) lateral resistance between p and n contact; 3) undepleted (if any) p- diamond bulk resistance; 4) drift resistance in the depleted p-region. The p+ diamond metal contact resistivity was studied by using a CTLM pattern and based on the extracted value of 9.75×10⁻⁶ ohm·cm², the contact resistance was around 0.1Ω, which is negligible to the total series resistance. For the lateral current spreading resistance, assuming resistivity ($\rho_{p+}$) of 1×10⁻¹ ohm·cm for diamond with a doping concentration of 1×10¹⁹/cm³, the lateral resistance was estimated as 20Ω under the conditions of a 13.5 μm thick p+ diamond, 60 μm×60 μm electrode, and 20 μm distance apart between two contacts. This calculated value was higher than the total series resistance of 12.5Ω and was believed to be caused by the underestimation of the conductivity near the diamond surface due to hole accumulation. This suggested that the lateral current spreading resistance was responsible for the majority of the total resistance. On the other hand, it also signified that the p– diamond region was fully depleted and would not contribute to the series resistance of the diode link. Moreover, this claim was corroborated by the resistance calculation of the p-diamond layer as 10 mΩcm² estimated from the bulk resistivity of the p-diamond layer (in the order of 10⁵ Ωcm), even if only 1 nm undepleted p-diamond region remained, which is more than two orders of magnitude higher than the total resistance. Thus, it was concluded that the on-resistance primarily originated from the lateral current spreading resistance between the p and n metal contacts, and that the p-diamond layer was fully depleted, which otherwise would have induced substantial resistance with this level of doping concentration. The Baliga's Power Figure of Merit BFOM of 1.25 GW/cm² at RT was calculated for the GaAs/diamond p-n diodes. This value has reached beyond the theoretical limitation (1000 MW/cm²) for the diamond Schottky diodes.

(See, e.g., Hitoshi Umezawa, et al., High temperature application of diamond power device, *Diamond and Related Materials* 24, 201-205, (2012).) Given that the majority of on resistance was induced by the lateral resistance between contacts, the BFOM of at least one order higher value could have been readily achieved if device layout had been reengineered to minimize the lateral distance.
Band Alignment and Electric Field Intensity To further investigate the high breakdown voltage properties of the heterogeneous GaAs/diamond diode, numerical simulations on the band alignment and electric field intensity across the diodes structure under reverse bias near breakdown were carried. The diamond electron affinity was set as 0.1 eV, and other parameters such as dimension and doping were matching the real diodes structure. It was found that, under reverse bias of -800 V, the band-bending in the p-diamond layer was extremely steep, which indicates the majority of the voltage was carried by this region. Furthermore, the electric field distribution confirmed that the electric field was primarily located in the p-diamond, which decreased exponentially into the GaAs and p+ diamond region due to the large doping concentration contrast with the p-diamond. The electric field within the p-diamond region increased from 5 MV/cm at the p+ side to 5 MV/cm at the GaAs side. Additionally, the depletion depth into the GaAs layer was less than 20 nm. The peak electric intensity at the GaAs surface was around 1.5 MV/cm, which is beyond the typical breakdown field value<1 MV/cm of GaAs bulk material. That the GaAs near the surface sustained this strong electric field without avalanche related breakdown was attributed to the very confined length of the electric field length. Based on the impact ionization induced avalanche process, the carriers required sufficient kinetic energy to excite a bound electron; therefore, the strong electric field and accelerating distance were both prerequisites for this process to occur. The distance of range where the electric field was above 1 MV/cm was less than 5 nm, through which the accumulated energy of carrier was not sufficient for ionizing other bound electrons.

Example 2: Si/Ge/Diamond p-n-p HBT

In this Example, diamond-based hybrid p-n-p heterojunction bipolar transistors (HBTs) that were formed with transferable single crystalline Si and Ge NMs have been realized. The HBTs include a p-Si NM emitter, n-Ge NM base, and a p-diamond collector that were bonded and passivated by an ultra-thin Al₂O₃ quantum tunneling layer, formed by ALD, at the interface. Using an oxygen surface treatment on the diamond, and passivation by the Al₂O₃ atomic thin layer, the HBTs achieved significant gains due to the sharp and large band offset differences between the emitter (Si NM) and the base (Ge NM). In addition, the high break-down voltage of the base-collector (B-C) diode demonstrates the superior electrical properties of diamond, and its usefulness in high-power and high-frequency HBT devices.
Results and Discussions The hybrid diamond collector HBT device fabrication began with the performance of the chemical cleaning process for a moderately boron doped p-type high-pressure and high-temperature (HPHT) diamond substrate. The diamond substrate was loaded in an ALD system and an Al₂O₃ layer (~0.5 nm thick) was deposited via five ALD cycles. The p+/p– Si NM and n+Ge NM were created from a silicon-on-insulator (SOI) wafer and a germanium-on-insulator (GeOI) wafer, which served as the emitter and base layer, respectively. The transfer printing method details, without using an adhesive layer, can be found elsewhere. (See, e.g., M. A. Meitl, Z. T. Zhu, V. Kumar, K. J. Lee, X. Feng, et al., Transfer printing by kinetic control of adhesion to an elastomeric stamp. *Nature Mater.* 5, 33-38 (2006).) For the base layer formation, the n+Ge NM was firstly bonded on the $Al_2O_3$-coated diamond substrate and annealed via rapid thermal anneal (RTA), followed by deposition of another thin $Al_2O_3$ passivation layer. Finally, the p+/p− Si NM for the emitter layer was bonded on top of the Ge/diamond. A Ti/Au stack emitter electrode was firstly deposited, followed by mesa-etching by a reactive ion etcher (RIE). A Ti/Au stack base electrode was deposited on the base mesa, and subsequently the diamond layer was exposed by RIE. Around 50 nm of the diamond layer was etched prior to ohmic metal Ti/Pt/Au deposition on the diamond substrate and annealing. In order to form an ohmic contact with the diamond, a thin $Al_2O_3$ layer was deposited via ALD prior to the metal deposition. All HBT devices were passivated with $SiO_2$ by plasma-enhanced chemical vapor deposition (PECVD) and completed by interconnection metal deposition. The widths of the emitter, base, and collector fingers of the HBTs were 4 μm, 3 μm, and 3 μm, respectively. The best ohmic behavior was achieved for annealing at 350° C. for 100 sec. The total emitter area was 160 $μm^2$.

The surface roughness of the bare diamond substrate and the transferred NM were measured using atomic force microscopy (AFM). The surface roughness of the bare diamond substrate and the transferred Ge NM were about 0.715 nm and 0.385 nm root mean square (RMS). The smooth surfaces of the NMs and diamond, which are similar to the polished wafer, enabled the creation of a high-quality bonding interface after transfer-printing. Furthermore, X-ray diffraction (XRD) and Raman spectroscopy were performed to evaluate the crystal quality of bare diamond substrate, as it was critical for their high-frequency and high-power operation in HBTs. The substrate clearly showed good sp3 bonding at 1332 $cm^{-1}$. Also, XRD confirmed a (4, 0, 0) crystal orientation with a full width at half maximum (FWHM) value of 0.018°, suggesting high crystallinity of the diamond substrate. The boron concentration was examined by Hall measurements, which showed carrier concentrations of ~$5 \times 10^{17}$ $cm^{-3}$.

Figure 8:
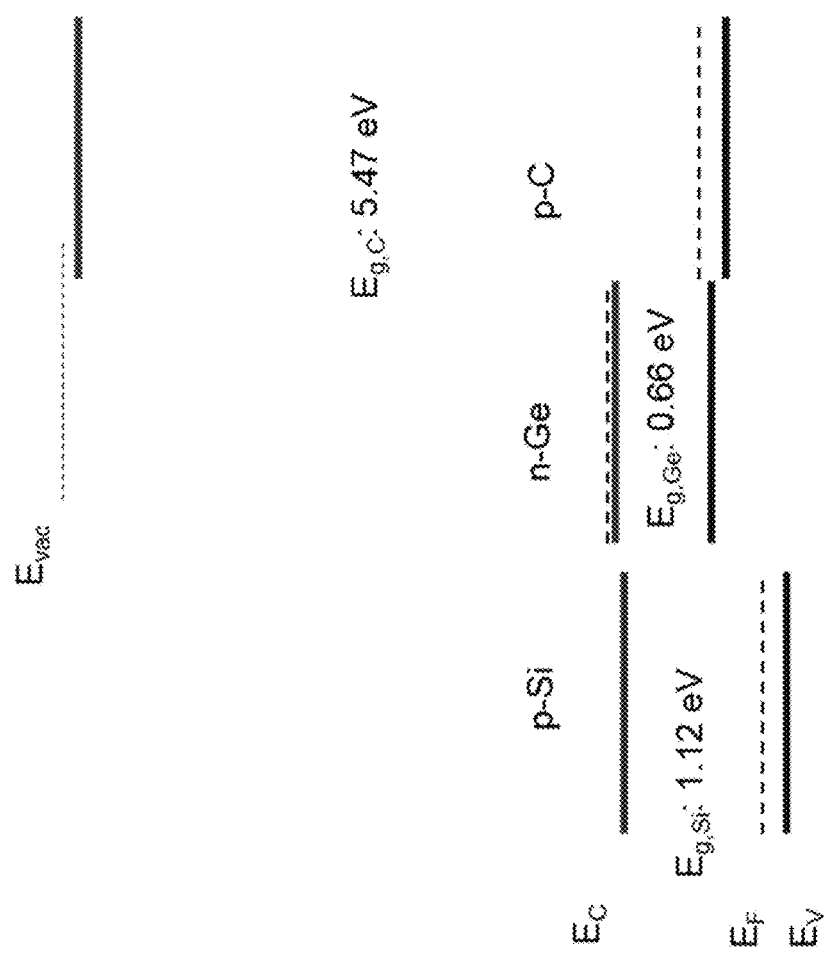
FIG. 8 shows the band alignments of the layers of the p-n-p HBT of Example 2 before contacting each other, with band gap values noted.

During a surface treatment process, the diamond substrate was firstly sintered at two different temperatures, 220° C. for 4 min, and 450° C. for 1 min, by the rapid thermal processor, followed by an oxygen plasma treatment for 30 secs (50 sccm of $O_2$, 100 mtorr, 10 W) by the reactive ion etcher. X-ray photoelectron spectroscopy (XPS) spectra taken before and after the surface engineering process showed an oxygen peak that appeared at 534 eV and became much stronger after the oxygen plasma treatment. Also, it was shown by a peak-fitting to the deconvolute peaks, corresponding to diamond sp3 C—C and C—O, that the distinct increase in the carbon-oxygen bonding peak indicated the larger proportion of carbon-oxygen bonding formed on the diamond surface after it was treated by oxygen plasma. It was observed that the typical bulk diamond sp3 C—C emission shifted by 0.24 eV, which can be explained by the difference in band bending near the diamond surface, accompanied by the electron affinity variation. The existence of a C—O peak before treatment indicated the diamond as received was not fully hydrogenated and contained a proportion of oxidized carbon. The oxygen bonding termination change was also confirmed by the contact angle measurements before and after the surface treatment. As the diamond surface termination changed from carbon-hydrogen dominant bonding to carbon-oxygen dominant bonding, the surface wettability was enhanced, resulting in a reduced contact angle. The corresponding values of the contact angle before and after oxygen treatment were θ=65.7° and 17.7°, which confirmed the increased ratio of C—O bonding by the oxygen plasma treatment. Based on the diamond surface condition examination, the band alignments of the pnp Si/Ge/C HBT before contact are illustrated in FIG. 8, which adopts a positive electron affinity for diamond.

Figure 9A:
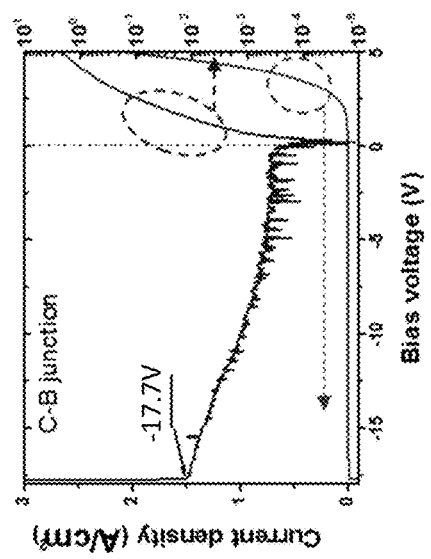
FIGS. 9A-9C depict DC characteristics of the p-n-p diamond HBTs.
Figure 9B:
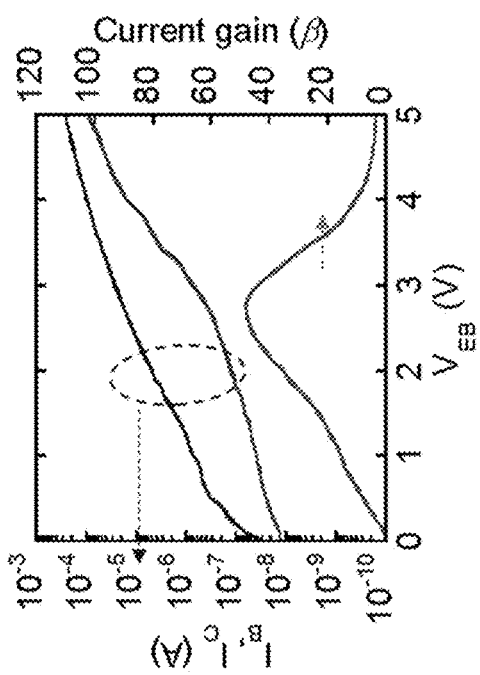
Figure 9C:
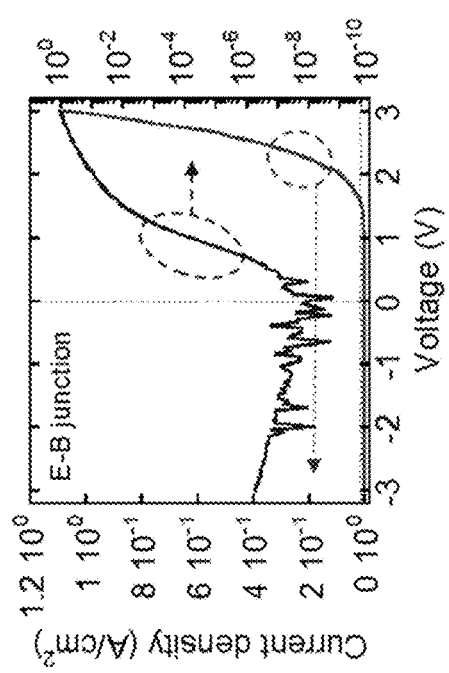
Figure 9D:
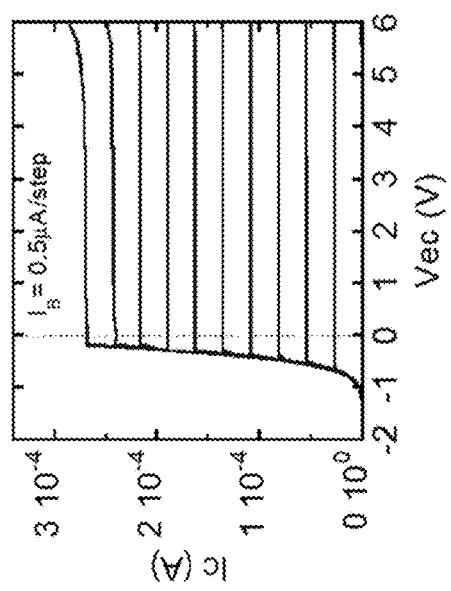
FIG. 9D depicts a Gummel plot showing the maximum current gain ($\beta_{max}$) of 49 at $V_{EB}$ of 2.8V.
Figure 10B:
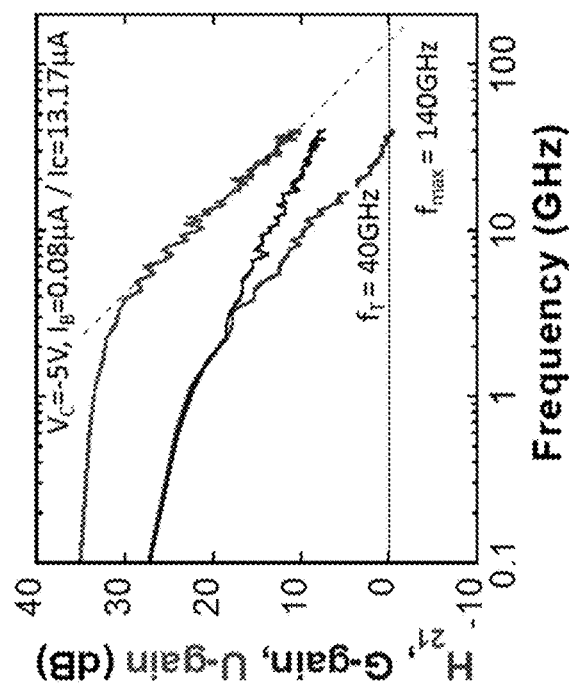
FIGS. 10A-10C show current gain and radio-frequency (RF) characteristics of the p-n-p diamond HBTs.
Figure 10A:
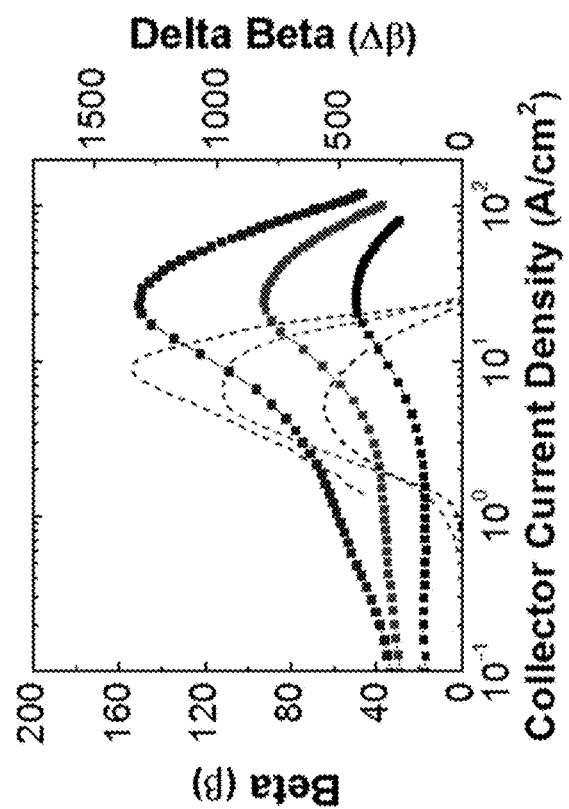
Figure 10C:
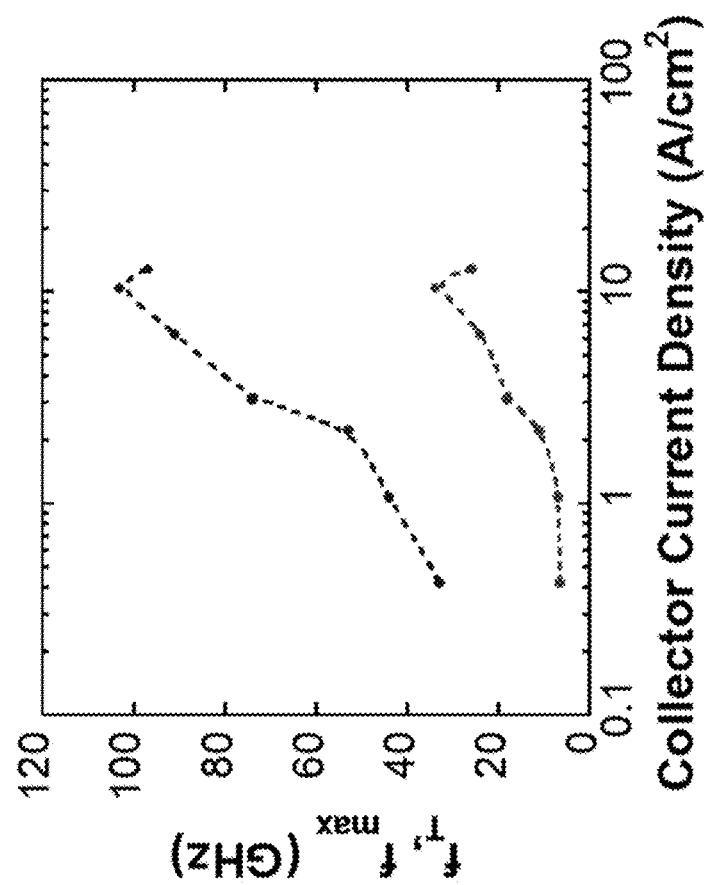

FIGS. 9A and 9B show the typical I-V characteristics from the emitter-base (E-B) junction diode and base-collector (C-B) junction diode, respectively. The E-B junction diode clearly showed good rectifying characteristics, with a $10^7$ times on/off ratio at ±3 V; and the C-B junction diode exhibited stable reverse current characteristics with a breakdown voltage greater than −17 V. Current-voltage measurements ($I_C$-$V_{EC}$) of the HBTs were carried out at room temperature to characterize the device performance. FIG. 9C shows the output characteristics of an HBT with an emitter mesa area of 4×40 $μm^2$. The HBTs functioned well up to 6 V when applied to the collector without breakdown. In FIG. 9D, the Gummel plot revealed that a maximum current gain ($β_{max}$) of 49 appeared at $V_{EB}$ of 2.8 V and output current of ~50 μA. The small output current can be further improved by optimizing the collector doping concentration and thickness, or by adopting a heavily doped p-type diamond underneath as a contact. The current gain as a function of the collector current density with varying $V_{CB}$ from 0 V to 2 V is shown in FIG. 10A. The peak current gain appeared at a collector current density of 25 $A/cm^2$. At a $V_{CB}$ of 2 V, the highest current gain measured was 150, which is related to the high bandgap offset between the base (Ge NM) and emitter (Si NM). As shown in FIG. 10A, the highest point of the derivative of the current gain was used as the bias points for the RF measurement. The HBTs were measured, and radio frequency (RF) characteristics showed unilateral power gain (U) and maximum stable gain (MSG)/maximum available gain (MAG) as a function of frequency at a bias point ($I_B$) of 0.06 μA and $V_{CB}$ of −5 V (FIG. 10B)). The unilateral power gain at 40 GHz was measured to be 12 dB, and higher power gain values at the operation frequency can be obtained by optimizing the collector doping level, the base thickness, and the emitter finger width. Moreover, as shown in FIG. 10C, the extrapolated $f_{max}$ and $f_T$ were 140 GHz and 40 GHz, respectively, both of which exhibited the highest values at a collector current density of 11 $A/cm^2$.

Methods

Generic HBT Fabrication Process:

Device fabrication began with a moderate boron doped p-type high-pressure and high-temperature (HPHT) diamond substrate (4 mm×4 mm), which served as the collector layer after completion of NM bonding. The diamond substrate was loaded in an ALD system and a very thin (~0.5 nm thick) $Al_2O_3$ layer was deposited on it. A p+/p− Si NM and n+Ge NM were created from a silicon-on-insulator (SOI) wafer and germanium-on-insulator (GeOI) wafer, which served as the emitter and base layers, respectively. For the base layer formation, the n+Ge NM was bonded on an $Al_2O_3$-coated diamond substrate and annealed via RTA, followed by the deposition of another very thin (~0.5 nm) $Al_2O_3$ layer. The p+/p− Si NM for the emitter layer was then bonded to the structure for a finished p-n-p Si/Ge/diamond heterostructure. A Ti/Au stack emitter electrode was deposited and mesa-etched by a reactive ion etcher (RIE). A Ti/Au stack base electrode was deposited and continued to be mesa-etched by RIE to the diamond layer. About 50 nm of the diamond layer was etched by oxygen plasma. An ohmic metal Ti/Pt/Au was deposited on the diamond substrate and annealed by RTA. All HBT devices were passivated with SiO$_2$ by plasma-enhanced chemical vapor deposition (PECVD) and completed by interconnect deposition.

Energy-dispersive X-ray (EDX) spectroscopy was performed to verify the existence of an Al$_2$O$_3$ ALD layer on the diamond substrate after 10 cycles of trimethylaluminium (TMA) and H$_2$O steps, which is equivalent to a 0.5 nm thick Al$_2$O$_3$ layer on the diamond substrate. The EDX spectra taken from different spots, and the magnification on the diamond substrate, confirm that the 0.5 nm thick Al$_2$O$_3$ ALD layer was uniformly deposited.

Figure 11B:
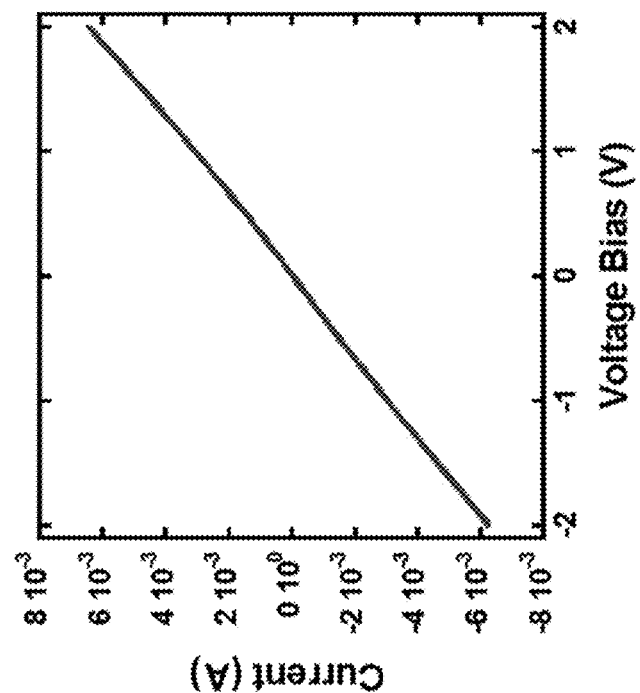
FIG. 11B shows the I-V characteristics between two collector metal contacts after annealing.
Figure 11A:
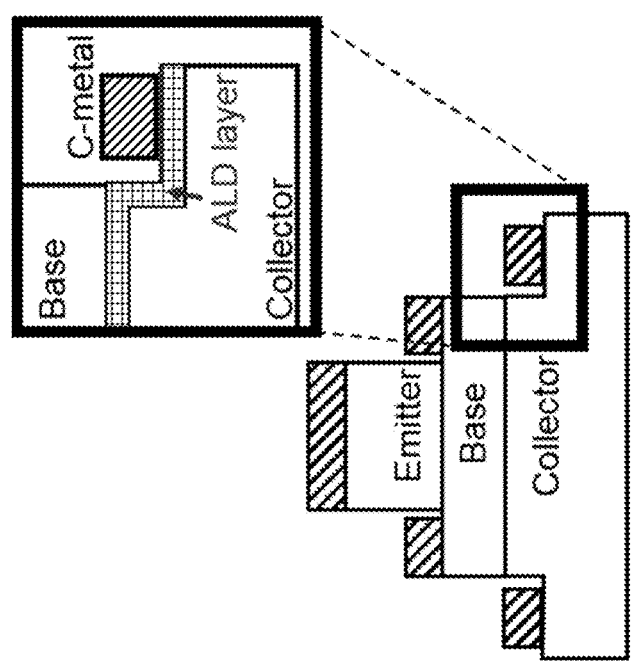
FIG. 11A is a schematic illustration of $Al_2O_3$ assisted ohmic metallization to the diamond substrate using a Ti/Pt/Au metal stack with a 1 nm $Al_2O_3$ ALD interlayer.

Ohmic Contact to the Diamond Collector Layer:

Forming an ohmic contact on diamond requires a high temperature annealing process. However, the ohmic annealing process for the diamond collector layer in a diamond/Ge/Si heterostructure is limited by the layer with the lowest thermal tolerance (Ge NM in this case). Therefore, it is not possible to perform a high temperature ohmic annealing process to achieve ohmic contact to diamond at a conventional annealing temperature range of 450° C.-600° C. To accommodate the NM thermal tolerance limit, an Al$_2$O$_3$ assisted Ti/Pt/Au ohmic metal stack was developed to effectively lower the required annealing temperature to form an ohmic metal by the insertion of an ultra-thin Al$_2$O$_3$ layer. As shown in FIG. 11A, the Ti/Pt/Au metal stack with a 1 nm Al$_2$O$_3$ ALD layer showed very good ohmic I-V characteristics (FIG. 11B) after annealing at 350° C. for 100 secs in N$_2$ ambient, which is 100-200° C. lower than the annealing temperature required for the conventional diamond-metal contact.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A p-n diode comprising:
a layer of p-type diamond having an upper surface with a positive electron affinity;
a layer of a single-crystalline n-type semiconductor material, the single-crystalline semiconductor material having a different lattice constant than the diamond; and
a current tunneling layer disposed between and in contact with the upper surface of the diamond and the lower surface of the layer of the single-crystalline n-type semiconductor material, wherein the current tunneling layer comprises an inorganic material having a bandgap that is wider than the bandgaps of the diamond and single-crystalline n-type semiconductor material and further wherein the inorganic material is not a native oxide of the single-crystalline n-type semiconductor material.

2. The diode of claim 1, wherein the n-type semiconductor material is n-type GaAs.

3. The diode of claim 2, wherein the inorganic material is aluminum oxide.

4. The diode of claim 2 having a breakdown voltage of at least 1 kV at a temperature of 25° C.

5. The diode of claim 1, wherein the n-type semiconductor material is n-type Ge.

6. The diode of claim 5, wherein the inorganic material is aluminum oxide.

7. A heterojunction bipolar transistor comprising:
a collector comprising a layer of p-type diamond having an upper surface with a positive electron affinity;
a base comprising a layer of a single-crystalline n-type semiconductor material, the single-crystalline n-type semiconductor material having a different lattice constant than the diamond;
a current tunneling layer disposed between and in contact with the upper surface of the layer of diamond and a lower surface of the layer of the single-crystalline n-type semiconductor material, wherein the current tunneling layer comprises an inorganic material having a bandgap that is wider than the bandgaps of the diamond and the single-crystalline n-type semiconductor material and further wherein the inorganic material is not a native oxide of the single-crystalline n-type semiconductor material; and
an emitter comprising a layer of a single-crystalline p-type semiconductor material.

8. The transistor of claim 7, wherein the single-crystalline n-type semiconductor material is n-type GaAs and the single-crystalline p-type semiconductor material is p-type AlGaAs.

9. The transistor of claim 7, wherein the single-crystalline n-type semiconductor material is n-type InGaAs and the single-crystalline p-type semiconductor material is p-type InAlAs.

10. The transistor of claim 7, wherein the single-crystalline n-type semiconductor material is n-type Ge and the single-crystalline p-type semiconductor material is p-type Si.

11. The transistor of claim 10, wherein the base-collector diode has a breakdown voltage of at least 15 V at a temperature of 25° C.

12. The transistor of claim 7 further comprising a second current tunneling layer disposed between and in contact with an upper surface of the of the layer of the single-crystalline n-type semiconductor material and a lower surface of the layer of a single-crystalline p-type semiconductor material.

* * * * *

UNITED STATES PATENT AND TRADEMARK OFFICE
CERTIFICATE OF CORRECTION

PATENT NO. : 10,497,817 B1
APPLICATION NO. : 16/029811
DATED : December 3, 2019
INVENTOR(S) : Zhenqiang Ma et al.

Page 1 of 1

It is certified that error appears in the above-identified patent and that said Letters Patent is hereby corrected as shown below:

In the Specification

Column 10, Line 62:
Delete the phrase "the ideality factor 11 fell as low as 1.27," and replace with --the ideality factor η fell as low as 1.27,--.

Column 11, Line 6:
Delete the phrase "an electrode of 60 μm × 60 under" and replace with --an electrode of 60 μm × 60 μm under--.

In the Claims

Claim 11, Column 16, Line 52-53:
Delete the phrase "breakdown voltage of at least 15 Vat a temperature of 25 °C." and replace with --breakdown voltage of at least 15 V at a temperature of 25 °C.--.

Signed and Sealed this
Twenty-first Day of January, 2020

Andrei Iancu
*Director of the United States Patent and Trademark Office*